(12) United States Patent
Keenihan et al.

(10) Patent No.: US 9,147,786 B2
(45) Date of Patent: Sep. 29, 2015

(54) PHOTOVOLTAIC DEVICE ASSEMBLY AND METHOD

(75) Inventors: James R. Keenihan, Midland, MI (US); Joseph A. Langmaid, Caro, MI (US); Robert J. Cleereman, Midland, MI (US); Andrew T. Graham, Midland, MI (US)

(73) Assignee: DOW GLOBAL TECHNOLOGIES LLC, Midland, MI (US)

( * ) Notice: Subject to any disclaimer, the term of this patent is extended or adjusted under 35 U.S.C. 154(b) by 831 days.

(21) Appl. No.: 12/989,743

(22) PCT Filed: May 1, 2009

(86) PCT No.: PCT/US2009/042523
§ 371 (c)(1),
(2), (4) Date: Jan. 5, 2011

(87) PCT Pub. No.: WO2009/137353
PCT Pub. Date: Nov. 12, 2009

(65) Prior Publication Data
US 2012/0118349 A1    May 17, 2012

Related U.S. Application Data

(60) Provisional application No. 61/050,341, filed on May 5, 2008, provisional application No. 61/098,941, filed on Sep. 22, 2008, provisional application No. 61/149,451, filed on Feb. 3, 2009.

(51) Int. Cl.
*H01L 31/042* (2014.01)
*H01L 31/05* (2014.01)
(Continued)

(52) U.S. Cl.
CPC .............. *H01L 31/05* (2013.01); *H01L 31/048* (2013.01); *H01L 31/0508* (2013.01);
(Continued)

(58) Field of Classification Search
CPC ............ H01L 31/0482; H01L 31/0458; H01L 31/0508; H01L 31/18; H01L 31/048; H01L 31/05; H01L 31/02008; H01R 31/00; H01R 12/79; H01R 13/639; H01R 13/055; H01R 13/113; H02S 40/34; H02S 40/36; H02S 20/25; Y10T 29/49117; Y10T 29/49826; Y10T 29/49355; Y02B 10/12; Y02E 10/50
USPC ........................................................ 136/244
See application file for complete search history.

(56) References Cited

U.S. PATENT DOCUMENTS 4,321,416 A    3/1982   Tennant
4,537,838 A    8/1985   Jetter et al.
(Continued)

FOREIGN PATENT DOCUMENTS

EP    1744372 A2    1/2007
EP    1923920 A1    5/2008
(Continued)

OTHER PUBLICATIONS

International Search Report for PCT/US2009/042523, dated Jan. 28, 2010.
(Continued)

*Primary Examiner* — Devina Pillay
(74) *Attorney, Agent, or Firm* — The Dobrusin Law Firm, P.C.

(57) ABSTRACT

The present invention is premised upon a connector device and method that can more easily electrically connect a plurality of PV arrays and/or locate these arrays upon a building or structure. It also can optionally provide some additional components (e.g. a bypass diode and/or an indicator means) and can enhance the serviceability of the array.

13 Claims, 24 Drawing Sheets

(51) Int. Cl.
    *H01R 31/00*      (2006.01)
    *H01L 31/18*      (2006.01)
    *H01R 12/79*      (2011.01)
    *H02S 40/34*      (2014.01)
    *H02S 40/36*      (2014.01)
    *H01L 31/048*      (2014.01)
    *H01R 13/639*      (2006.01)
    *H01R 13/05*      (2006.01)
    *H01R 13/11*      (2006.01)

(52) U.S. Cl.
CPC .............. *H01L 31/18* (2013.01); *H01R 12/79* (2013.01); *H01R 13/639* (2013.01); *H01R 31/00* (2013.01); *H02S 40/34* (2014.12); *H02S 40/36* (2014.12); *H01R 13/055* (2013.01); *H01R 13/113* (2013.01); *Y02B 10/12* (2013.01); *Y02E 10/50* (2013.01); *Y10T 29/49117* (2015.01); *Y10T 29/49355* (2015.01); *Y10T 29/49826* (2015.01)

(56) References Cited

U.S. PATENT DOCUMENTS

| | | |
|---|---|---|
| 5,437,735 A | 8/1995 | Younan et al. |
| 5,575,861 A | 11/1996 | Younan et al. |
| 5,590,495 A | 1/1997 | Bressler et al. |
| 5,706,617 A | 1/1998 | Hirai et al. |
| 5,986,203 A | 11/1999 | Hanoka et al. |
| 5,990,414 A | 11/1999 | Posnansky |
| 6,840,799 B2 | 1/2005 | Yoshikawa et al. |
| 6,875,914 B2 | 4/2005 | Guha et al. |
| 7,365,266 B2 | 4/2008 | Heckeroth |
| 7,713,089 B2 | 5/2010 | Faust et al. |
| 2005/0022857 A1 | 2/2005 | Datoczi et al. |
| 2005/0141153 A1 | 6/2005 | Mucci et al. |
| 2006/0283628 A1 | 12/2006 | Feldmeier et al. |
| 2007/0193618 A1* | 8/2007 | Bressler et al. ............ 136/244 |
| 2007/0295392 A1 | 12/2007 | Cinnamon |
| 2007/0295393 A1 | 12/2007 | Cinnamon |
| 2008/0115822 A1 | 5/2008 | Cunningham et al. |
| 2008/0139102 A1 | 6/2008 | Major |
| 2008/0190047 A1 | 8/2008 | Allen |
| 2010/0180523 A1 | 7/2010 | Lena et al. |
| 2011/0048504 A1* | 3/2011 | Kinard et al. ............ 136/251 |

FOREIGN PATENT DOCUMENTS

| | | |
|---|---|---|
| JP | 57031236 | 2/1982 |
| JP | 58-086781 A | 5/1983 |
| JP | 58133945 U | 9/1983 |
| JP | 59191748 U | 12/1984 |
| JP | 08-186280 A | 7/1996 |
| JP | 9312175 A | 12/1997 |
| JP | 11-22127 A | 1/1999 |
| JP | H11 22127 A | 1/1999 |
| JP | 11-040835 A | 2/1999 |
| JP | 2000-012884 A | 1/2000 |
| JP | 2004-207408 A | 7/2004 |
| JP | 2005-009130 A | 1/2005 |
| JP | 2005072101 A | 3/2005 |
| JP | 2006147905 A | 6/2006 |
| JP | 20060147905 A | 6/2006 |
| JP | 2006339659 A | 12/2006 |
| JP | 20066339659 A | 12/2006 |
| WO | 03044299 A2 | 5/2003 |
| WO | 2008/139102 A2 | 11/2008 |
| WO | 2009/137347 | 11/2009 |
| WO | 2009/137348 | 11/2009 |
| WO | 2009/137352 | 11/2009 |

OTHER PUBLICATIONS

Second European Office Action dated Jun. 18, 2011, for related European Patent Application No. 097443340.3.
Commonly Owned Patent Application to Gaston U.S. Appl. No. 12/989,344, filed Oct. 26, 2010, 371 Application WO2009/137352.
Office Action for Corresponding EP Application No. 09 743 340.3, dated Jun. 18, 2013.
Second Australian Office Action dated Oct. 9, 2012, for related Australian Patent Application No. 2009/244549.
Canadian Office Action dated Nov. 13, 2012, for related Canadian Patent Application No. 2,723,395.
Second European Office Action dated Jun. 18, 2012, for related European Patent Application No. 097443340.3.
Mexican Office Action dated Sep. 27, 2012, for related Mexican Patent Application No. 2010/012073.
Notice of Second Mexican Office Action dated May 3, 2013, for related Mexican Patent Application No. 2010/012073.
International Preliminary Report on Patentability, dated Aug. 13, 2010, for corresponding PCT Application No. PCT/US2009/042523.
Commonly Owned Patent Application to Gaston U.S. Appl. No. 12/989,744, filed Oct. 26, 2010, 371 Application WO2009/137352.
Examiner's Report Australian Patent Application 2009244549 dated Dec. 19, 2011.
First Office Action Chinese Patent Application No. 2009801160989.5 dated Jun. 11, 2012.
EP Office Action for EP 09743340.3 dated Apr. 17, 2012.
JP Office Action for JP 2011-507681 dated Jul. 31, 2012.
KR Office Action for Kr 10-2010-7027230 dated Nov. 25, 2011.
Co-Pending Co-owned U.S. Appl. No. 12/989,744 Publication 20120118361.

* cited by examiner

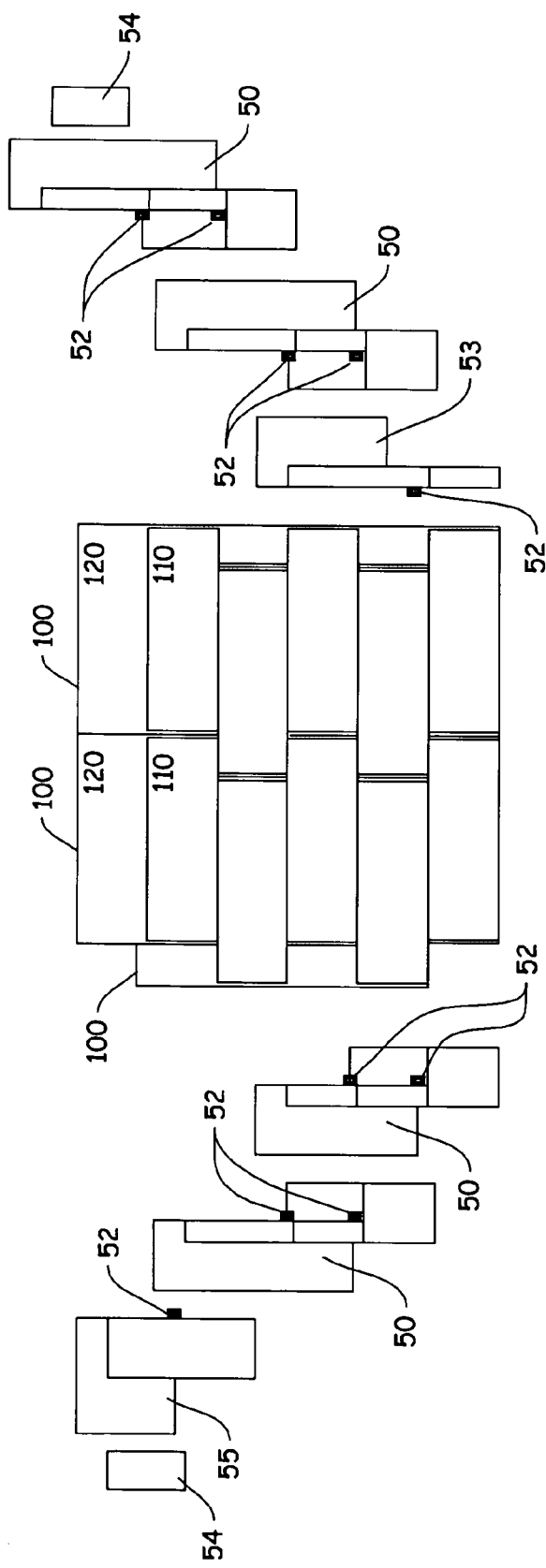

PHOTOVOLTAIC DEVICE ASSEMBLY AND METHOD

CLAIM OF BENEFIT OF FILING DATE

The present application claims the benefit of the filing date of PCT Application Serial No. PCT/US2009/042523 (filed May 1, 2009) (Published as WO 2009/137353); U.S. Provisional Application Ser. No. 61/050,341 (filed May 5, 2008); U.S. Provisional Application Ser. No. 61/098,941 (filed Sep. 22, 2008); and U.S. Provisional Application Ser. No. 61/149,451 (filed Feb. 3, 2009) the contents of which are hereby incorporated by reference in their entirety.

This invention was made with U.S. Government support under contract DE-FC36-07G017054 awarded by the Department of Energy. The U.S. Government has certain rights in this invention.

FIELD OF THE INVENTION

The present invention relates to an improved photovoltaic device assembly and method of making same, more particularly to an improved photovoltaic device assembly (kit) and method of making same for providing solar power.

BACKGROUND

Efforts to improve photovoltaic ("PV") devices or photovoltaic arrays, particularly to improve the connection, installation, and service of multiple devices are subject to continuing development within the PV industry. Of special interest are those PV devices that are integrated into building structures or fascia (e.g. roofing shingles, exterior wall surfaces, canopies, awnings), or stand alone PV systems (e.g. solar farms). To aid in their commercial and functional viability, they should satisfy a number of criteria. The individual arrays and the overall assembly (sometimes known as a kit) should be robust, that is they should be able to remain functional in a myriad of environmental conditions (e.g. heat, cold, wind, rain, snow, etc.). In the case of building structures, they should also not subject the building structure to overly adverse modifications due to their presence, such as multiple roof penetrations made to electrically connect and/or locate the plurality of arrays, resulting in the roof which could have to be subsequently sealed against leaks. The roof penetrations and/or extensive wiring can make installation time consuming and expensive. In either a building structure or stand alone PV system, the relative ease of installation provided by the present invention can be advantageous. Furthermore, when an array component (e.g. a single panel and/or a sub-component such as a bypass diode) does become damaged or needs to be replaced, it can be valuable to have a system that allows easy replacement of the array component or sub-component.

Among the literature that can pertain to this technology include the following patent documents: US20080190047 (A1); U.S. Pat. No. 4,321,416; U.S. Pat. No. 5,575,861; U.S. Pat. No. 5,437,735; U.S. Pat. No. 5,990,414; U.S. Pat. No. 6,840,799; EP1744372; U.S. Pat. No. 6,875,914; U.S. Pat. No. 5,590,495; U.S. Pat. No. 5,986,203; US2008/0115822; EP1923920; U.S. Pat. No. 7,365,266; US20070295393 A1; US20070295392 A1; and WO 2008/139102, U.S. Provisional Application Nos. 61/050,341 (filed 5 May 2008); 61/098,941 (filed 22 Sep. 2008); 61/149,451 (filed 3 Feb. 2009), and PCT Applications filed concurrently for international filing Nos. PCT/US2009/042492; PCT/US2009/042496; and PCT/US2009/042522 filed concurrently with the present application, all incorporated herein by reference for all purposes.

SUMMARY OF THE INVENTION

The present invention is directed to a solution to at least one or more of the issues described above. Particularly, the present invention seeks to provide a robust photovoltaic device assembly and method that can more easily electrically connect a plurality of PV arrays and/or locate these arrays upon a structure (e.g. a building wall, building roof, or platform). It also can optionally provide some additional components (e.g. a spacer piece/device and/or connector pieces) and can enhance the serviceability of the array.

Accordingly, pursuant to a first embodiment of the present invention, there is contemplated a photovoltaic device kit including: a. at least a plurality of photovoltaic devices in at least two rows or columns as applied to a structure, the photovoltaic device including: i. a photovoltaic cell assembly including at least one peripheral edge, at least one photovoltaic cell inboard of the at least one peripheral edge, which the photovoltaic cell includes a photoactive portion, wherein the at least one photovoltaic cell includes a surface that allows transmission of light energy to the photoactive portion for conversion into electrical energy; ii. at least one buss terminal for transferring current to or from the photovoltaic cell assembly; iii. a body portion including lower surface portion that contacts the structure, and an upper surface portion that receives a fastener that attaches the photovoltaic device to the structure, wherein the body portion is at least partially joined to at least one edge portion of the photovoltaic cell assembly along at least a portion of a bottom segment of the body portion while leaving the surface of the at least one photovoltaic cell exposed; b. at least one edge piece disposed at the end or within the at least two rows of photovoltaic devices, the at least one edge piece including at least two edge connector assemblies for connecting each respective row of photovoltaic devices.

Accordingly, pursuant to a second embodiment of the present invention, there is contemplated a photovoltaic device assembly including: a. a plurality of first photovoltaic devices individually interconnected via a plurality of photovoltaic array connector assemblies in a first row or column; b. a plurality of second photovoltaic devices individually interconnected via the plurality of photovoltaic array connector assemblies in a second row or column, wherein both the first and second photovoltaic devices include an electrical return circuit; and c. a first edge piece spanning between and connecting the first and second rows or columns at one end and a second edge piece spanning between and connecting the first and second rows or columns at an opposing end, wherein at least the first edge piece includes a first electrical circuit that includes at least a pass-though electrical connector or electrical lead assembly and wherein at least the second edge piece includes a second electrical circuit that includes at least an electrical return circuit interconnect.

The invention of both the first and/or second embodiments can be further characterized by one or any combination of the features described herein, such as including at least one spacer device connected between two photovoltaic devices, one photovoltaic device and one edge piece, or both; the at least one edge piece includes a building connector assembly or electrical lead assembly; includes at least one integral photovoltaic connector assembly located within the at least one peripheral edge, a separate connector, or both; the at least one integral photovoltaic connector assembly, the at least two edge connector assemblies, or both include a strain relief feature; the at least one integral photovoltaic connector assembly, the at least two edge connector assemblies, or both, further includes an integral connector housing adapted to receive a connector element; the connector element, comprises: a. a base portion including a first end portion, a second end portion, an intermediate portion and an outer surface; b. a locator portion located on the outer surface of the intermediate portion, the locator portion including a bearing wall that is shaped to generally complement the integral connector housing; and c. at least one electrically conductive member that is substantially surrounded by the base portion and that spans between the first and second end portions and includes connective terminals at opposing ends that are shaped to interlock with an opposing terminal in the integral connector housing, so that the bearing wall partially contacts an opposing surface in the integral connector housing; the at least one edge piece includes at least one edge connector assembly for connecting to a second edge piece; the at least one edge piece includes an indicator device to communicate a circuit status; the structure is a building.

Looking more towards the second embodiment, it can be further characterized by one or any combination of the features described herein, such as including a second edge piece spanning between and connecting the first and second rows or columns at an opposing end, wherein at least the first edge piece includes a first electrical circuit that includes at least a pass-though electrical connector or electrical lead assembly and wherein at least the second edge piece includes a second electrical circuit that includes at least an electrical return circuit interconnect; the plurality of first photovoltaic devices and the plurality of second photovoltaic devices comprise: a. a photovoltaic cell assembly including at least one peripheral edge, at least one photovoltaic cell inboard of the at least one peripheral edge, which the photovoltaic cell includes a photoactive portion, wherein the at least one photovoltaic cell includes a surface that allows transmission of light energy to the photoactive portion for conversion into electrical energy; b. at least one buss terminal for transferring current to or from the photovoltaic cell assembly via at least one integral photovoltaic connector assembly located within the at least one peripheral edge; and c. a body portion including lower surface portion that contacts a structure, and an upper surface portion that receives a fastener that attaches the photovoltaic device to the structure, wherein the body portion is at least partially joined to at least one edge portion of the photovoltaic cell assembly along at least a portion of a bottom segment of the body portion while leaving the surface of the at least one photovoltaic cell exposed; the body portion and at least one peripheral edge at least include a unitary polymeric portion; the first edge piece and the second edge piece comprise a polymeric body that substantially envelops at least a portion of the first and second electrical circuits respectfully; the integral photovoltaic connector assembly includes a locator feature for locating one of the plurality of first photovoltaic devices and the plurality of second photovoltaic devices to another or to the first or second end piece within the respective row; the first row, second row, or both, include at least one spacer device; the structure is a building.

Accordingly, pursuant to a third embodiment of the present invention, there is contemplated a method of constructing a method of constructing a photovoltaic device assembly on a surface of a structure, including the steps of: a. providing a plurality of individual photovoltaic devices, wherein the individual photovoltaic devices include: i. a photovoltaic cell assembly including at least one peripheral edge, at least one photovoltaic cell inboard of the at least one peripheral edge, which the photovoltaic cell includes a photoactive portion, wherein the at least one photovoltaic cell includes a surface that allows transmission of light energy to the photoactive portion for conversion into electrical energy; ii. at least one buss terminal for transferring current to or from the photovoltaic cell assembly; and iii. a body portion including lower surface portion that contacts the structure, and an upper surface portion that receives a fastener that attaches the photovoltaic device to the structure, wherein the body portion is at least partially joined to at least one edge portion of the photovoltaic cell assembly along at least a portion of a bottom segment of the body portion while leaving the surface of the at least one photovoltaic cell exposed; b. providing a plurality of edge pieces; c. attaching a first individual photovoltaic device to the surface; d. attaching a second individual photovoltaic device to the first individual photovoltaic device; e. attaching the second individual photovoltaic device to the surface; f. repeat steps c-e until a first row or column is attached to the surface; g. begin attaching a second row or column of individual photovoltaic devices immediately adjacent to in partial contact with the first row or column, using the same steps as the first row or column; and h. attaching at least one edge piece via a connector element to at least one end of the first and second row or column.

The invention of the third embodiment can be further characterized by one or any combination of the features described herein, such as including the step of providing a spacer device; the first row/column, second row/column, or both, include at least one spacer device in place of at least one of the individual photovoltaic devices; the steps c-h are repeated to create the photovoltaic device assembly with a plurality of rows/columns; a separate connector element is provided which includes: i. a base portion including a first end portion, a second end portion, an intermediate portion and an outer surface; ii. a locator portion located on the outer surface of the intermediate portion, the locator portion including a bearing wall that is shaped to generally complement the integral connector housing; and iii. at least one electrically conductive member that is substantially surrounded by the base portion and that spans between the first and second end portions and includes connective terminals at opposing ends that are shaped to interlock with an opposing terminal in the integral connector housing, so that the bearing wall partially contacts an opposing surface in the integral connector housing; some or all of the plurality of connector elements have the first end portion integral to the edge piece, the photovoltaic device, or both; the structure is a building; providing at least one integral photovoltaic connector assembly located within the at least one peripheral edge, a separate connector, or both.

It is also should be appreciated that the present invention contemplates a photovoltaic device assembly and method comprising a plurality of PV arrays of any of the embodiments described above or subsequently in this application.

It should be appreciated that the above referenced embodiments and examples are non-limiting, as others exist within the present invention, as shown and described herein.

DESCRIPTION OF THE DRAWINGS

FIG. 2 is one exemplary illustration of a partial exploded view of a kit of FIG. 1 according to the present invention.

DETAILED DESCRIPTION OF THE PREFERRED EMBODIMENT

The present invention is a photovoltaic device assembly (or kit) and method of making same. This assembly can include a plurality of photovoltaic devices ("PV devices" or "PVD") that are placed in rows or columns (e.g. two or more); wherein the devices can be both physically and electrically connected by connectors, edge pieces, spacer pieces, or any combination thereof. The assembly is configured to aid in providing quick and easy installation and to reduce the number of potential structure, (façade or roof—in the case of the preferred structure of a building roof application) penetrations needed. Preferably, the photovoltaic device assembly utilizes PV devices and connectors that are the same or similar (functionally and/or structurally) to those described in U.S. patent application Ser. Nos. 61/050,341 and 61/098,941, both hereby incorporated by reference for all purposes.

Figure 1:
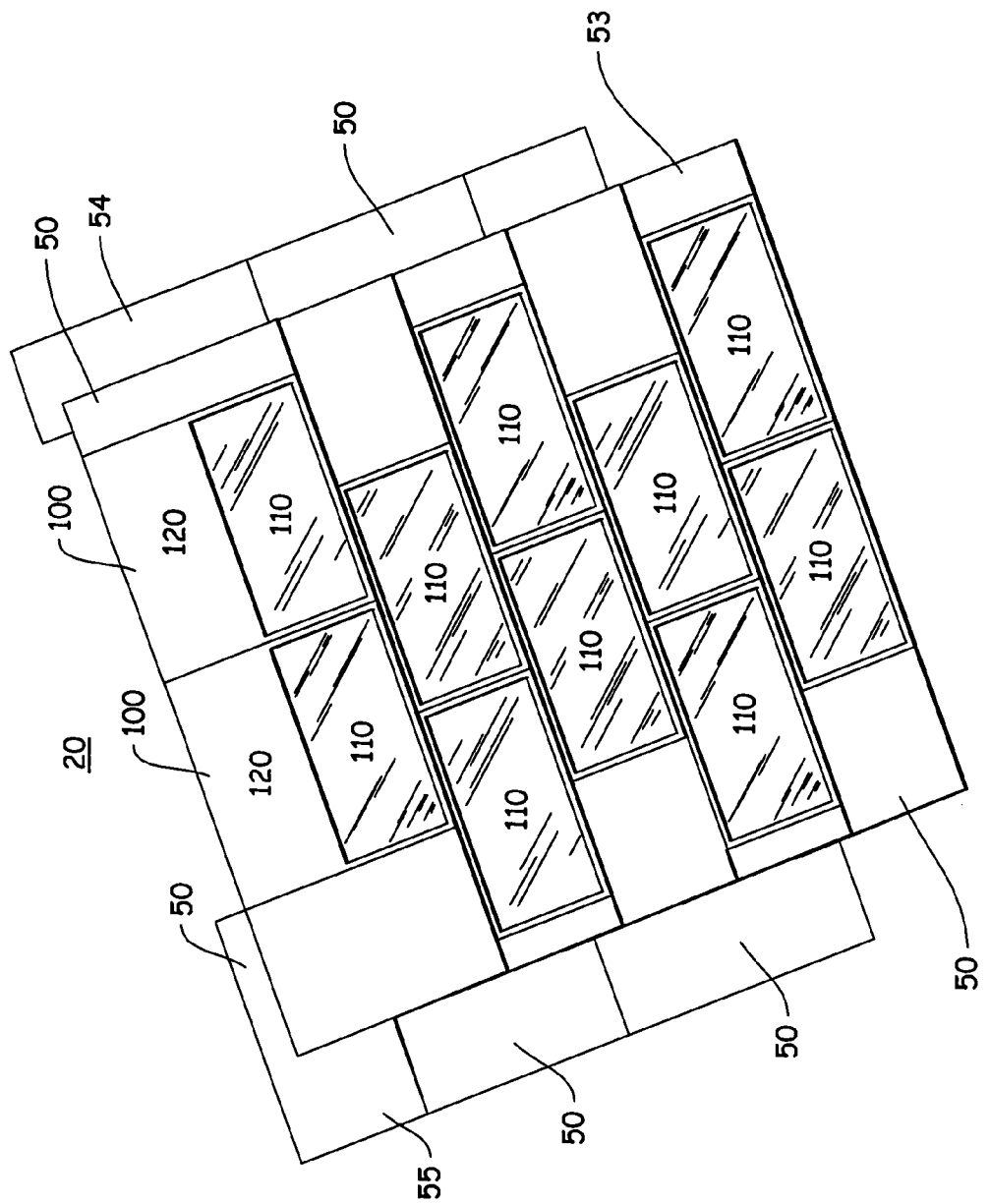
FIG. 1 is an exemplary illustration of a perspective view of an assembled kit (row) according to the present invention.
Figure 1A:
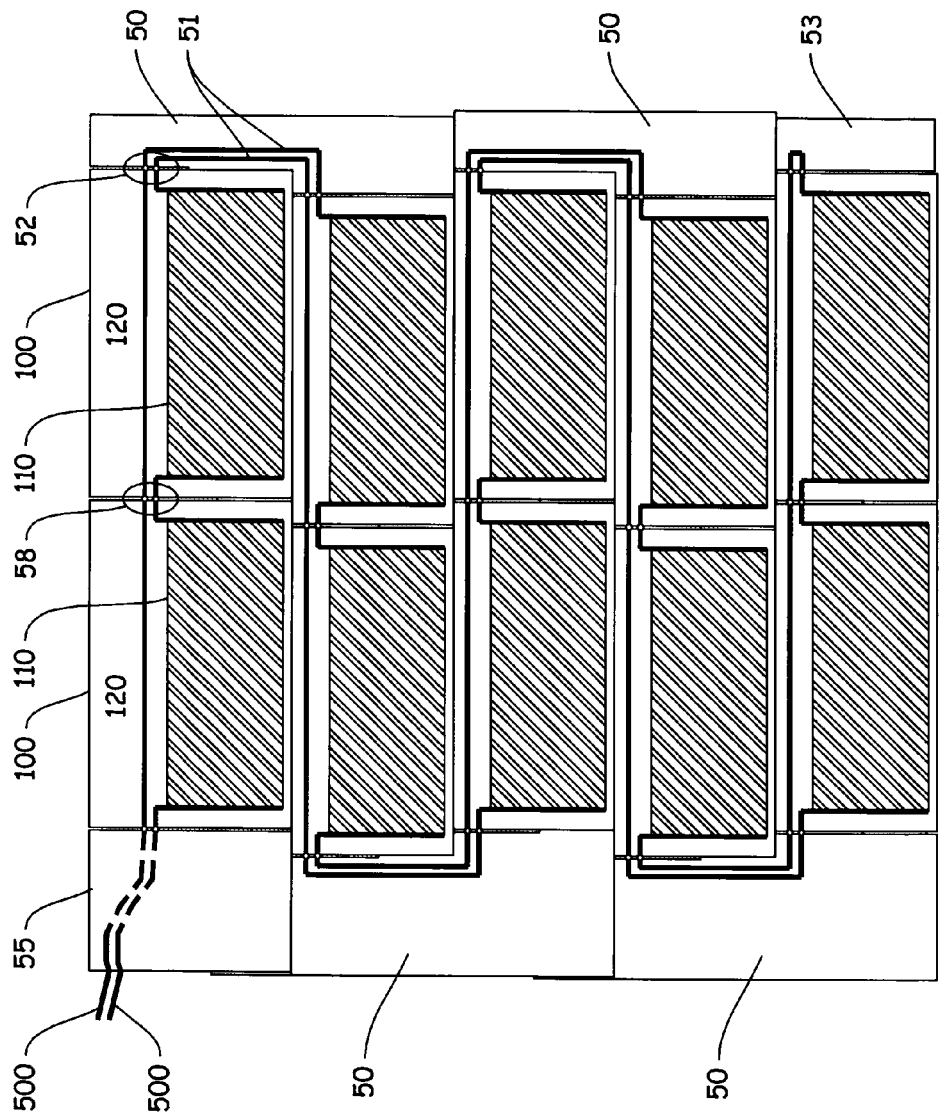
FIG. 1A is an exemplary illustration of a schematic of the one possible assembled kit derivation shown in FIG. 1, according to the present invention
Figure 19:
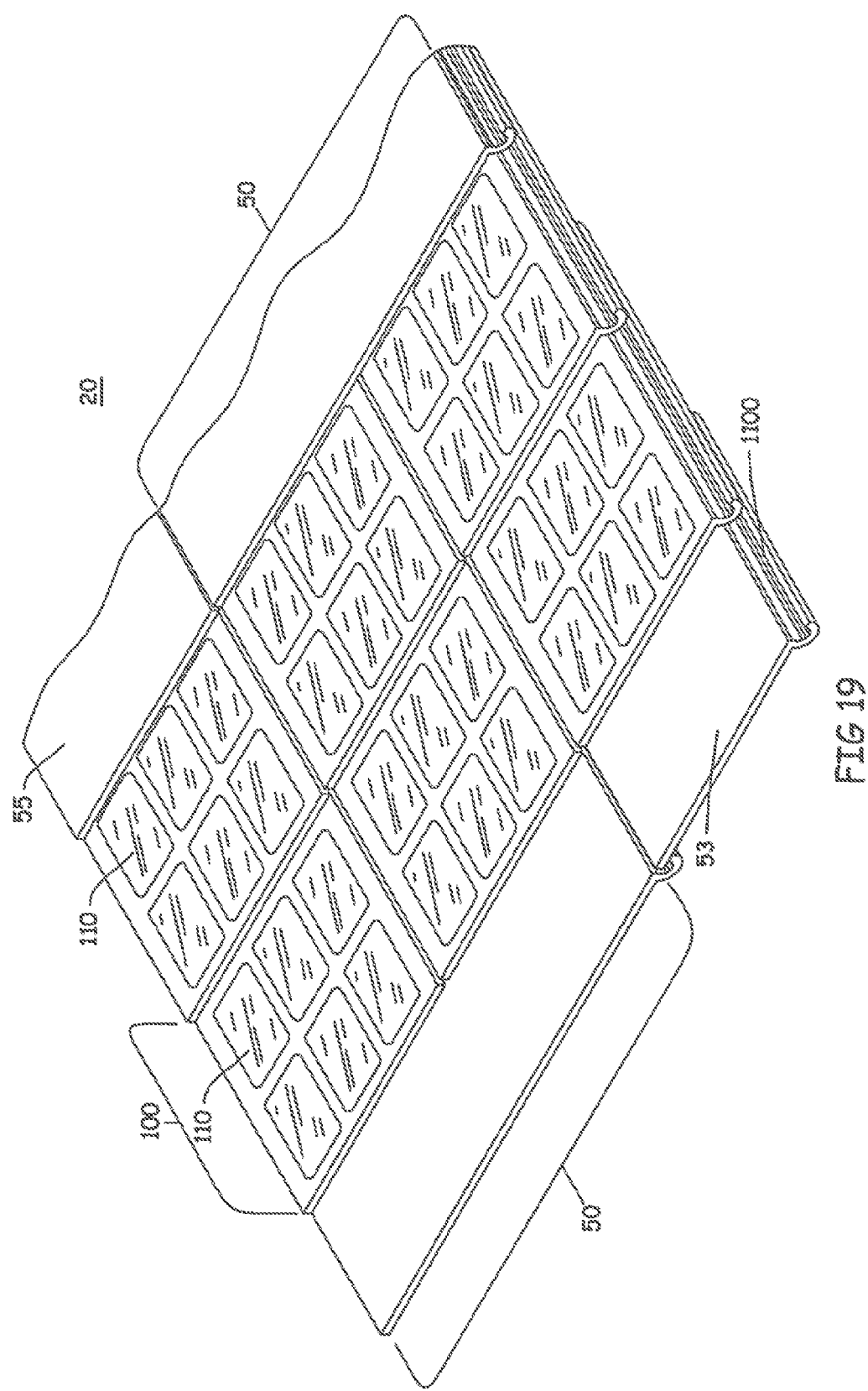
FIG. 19 is an exemplary illustration of a perspective view of an assembled kit (column) according to the present invention.
Figure 20:
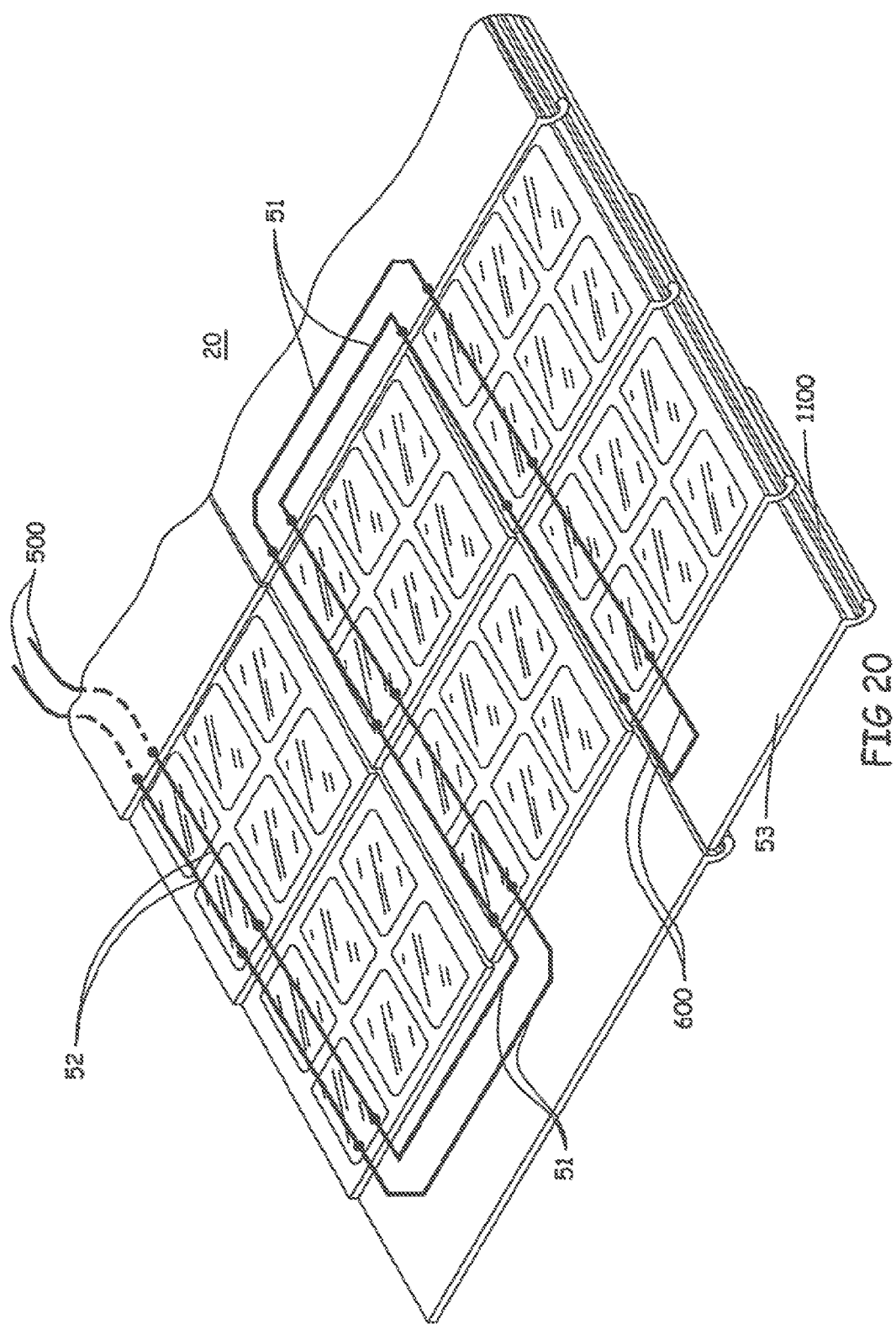
FIG. 20 is an exemplary illustration of a schematic of one possible kit (column) derivation according to the present invention.
Figure 21:
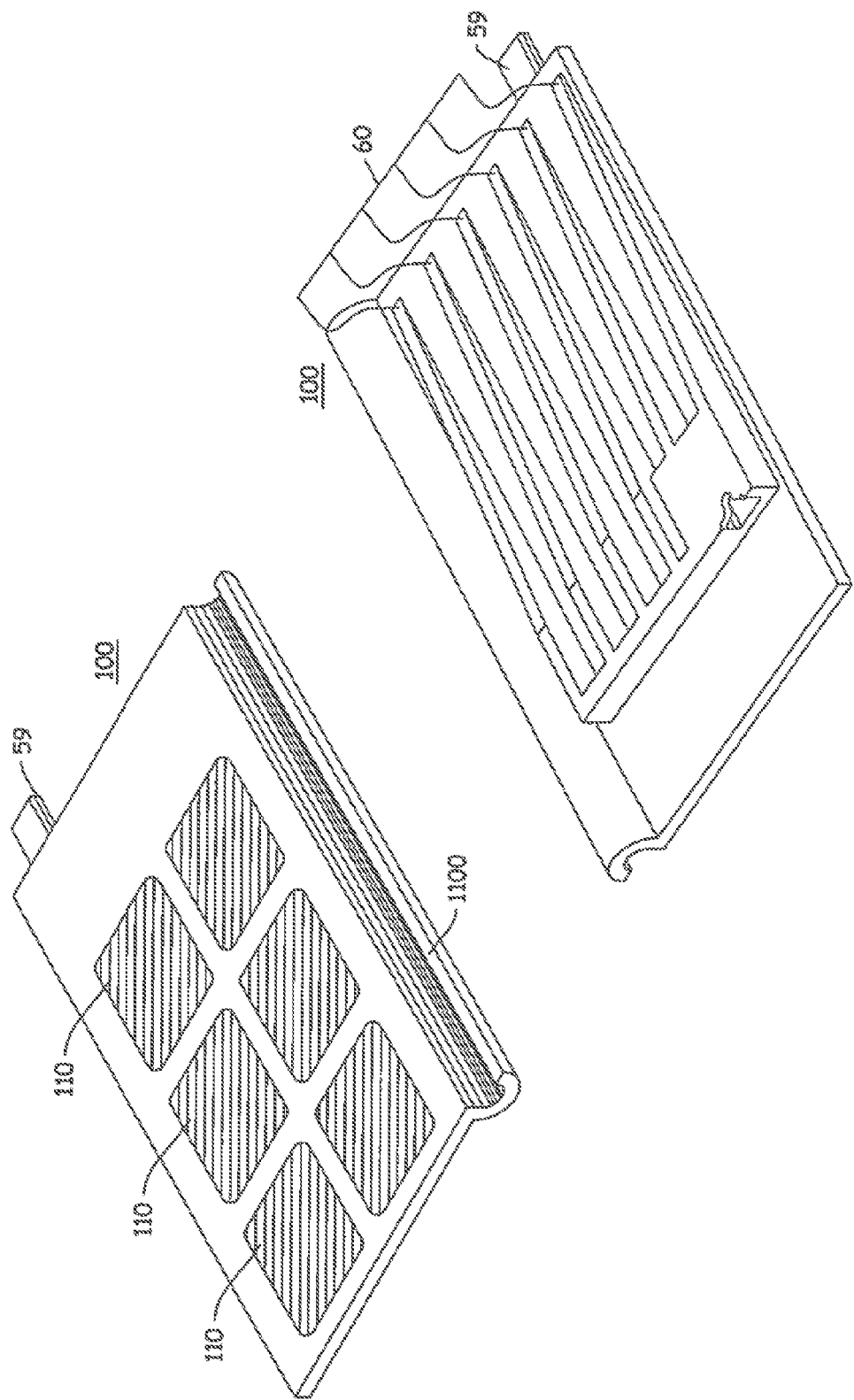
FIG. 21 an exemplary illustration of two perspective views (top and bottom) of a PV device (column kit) according to the present invention.

Generally, the present invention contemplates a photovoltaic device assembly or kit 20 (for example as a row configuration as shown in FIG. 1 fully assembled and FIG. 2 in a partially exploded view and for example as a column configuration fully assembled as shown in FIG. 19 and FIG. 20) that can include at least a plurality of PV devices 100 in at least two rows or columns as applied to a building (or other structure). The kit 20, can include at least one edge piece 50 located at the end or within the at least two rows/columns of photovoltaic devices 100 that can be further described as including a photovoltaic cell assembly 110 and a body portion 120.

Figure 3:
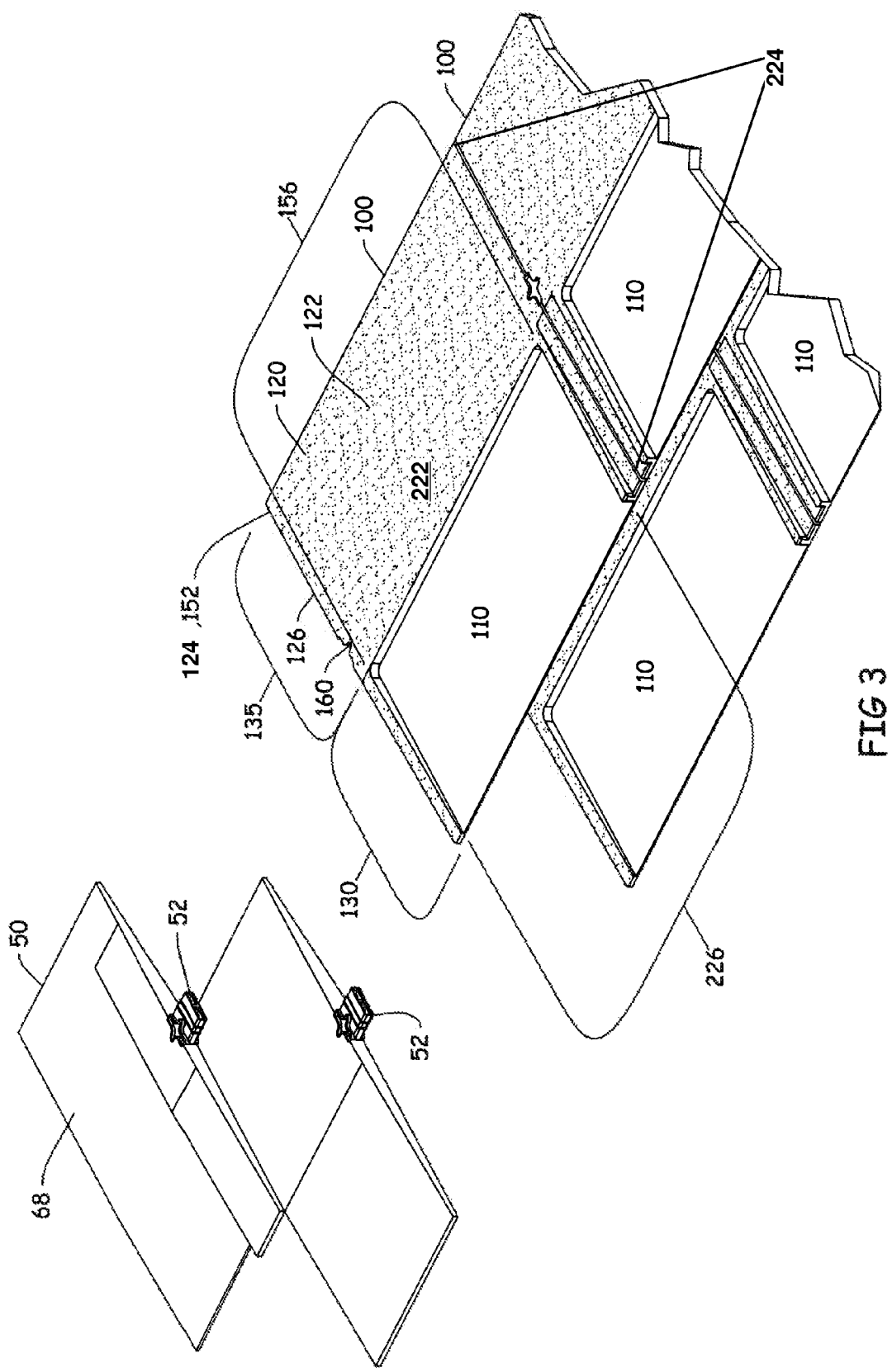
FIG. 3 is a partial exploded view of the bottom two rows (left side) of the kit of FIG. 2.

The edge piece 50 may include two or more edge connector assemblies 52 for connecting each respective row or column of photovoltaic devices. The edge piece can include electrical element or elements 51 incorporated between edge connector assemblies 52 such that the rows are electrically connected together or have a single electrical output 500 from the kit 20 at or near an outer edge of the kit. In certain cases, the edge piece may only include a single edge connector assembly 52, such as in the case of a starter piece 53 or an end piece 55. In other cases, the edge piece may have no electrical connector assemblies 52 and function solely as a filler piece 54. Preferably, the edge connector assemblies and the photovoltaic array connector assemblies 58 are the same or similar (e.g. functionally and/or structurally). A description for one is intended to apply to the other unless specifically stated otherwise. The edge piece connector assembly can be, as in the first embodiment, integral to the edge piece (i.e. located within at least one peripheral edge of an edge piece as is shown in FIGS. 2 and 3) or it can be a separate element that is used in the assembly between one peripheral edge of an edge piece and one peripheral edge of a PV device or between peripheral edges of adjacent edge pieces and mating to the connector housing or connector elements in those pieces, depending on the kit design.

Figure 6:
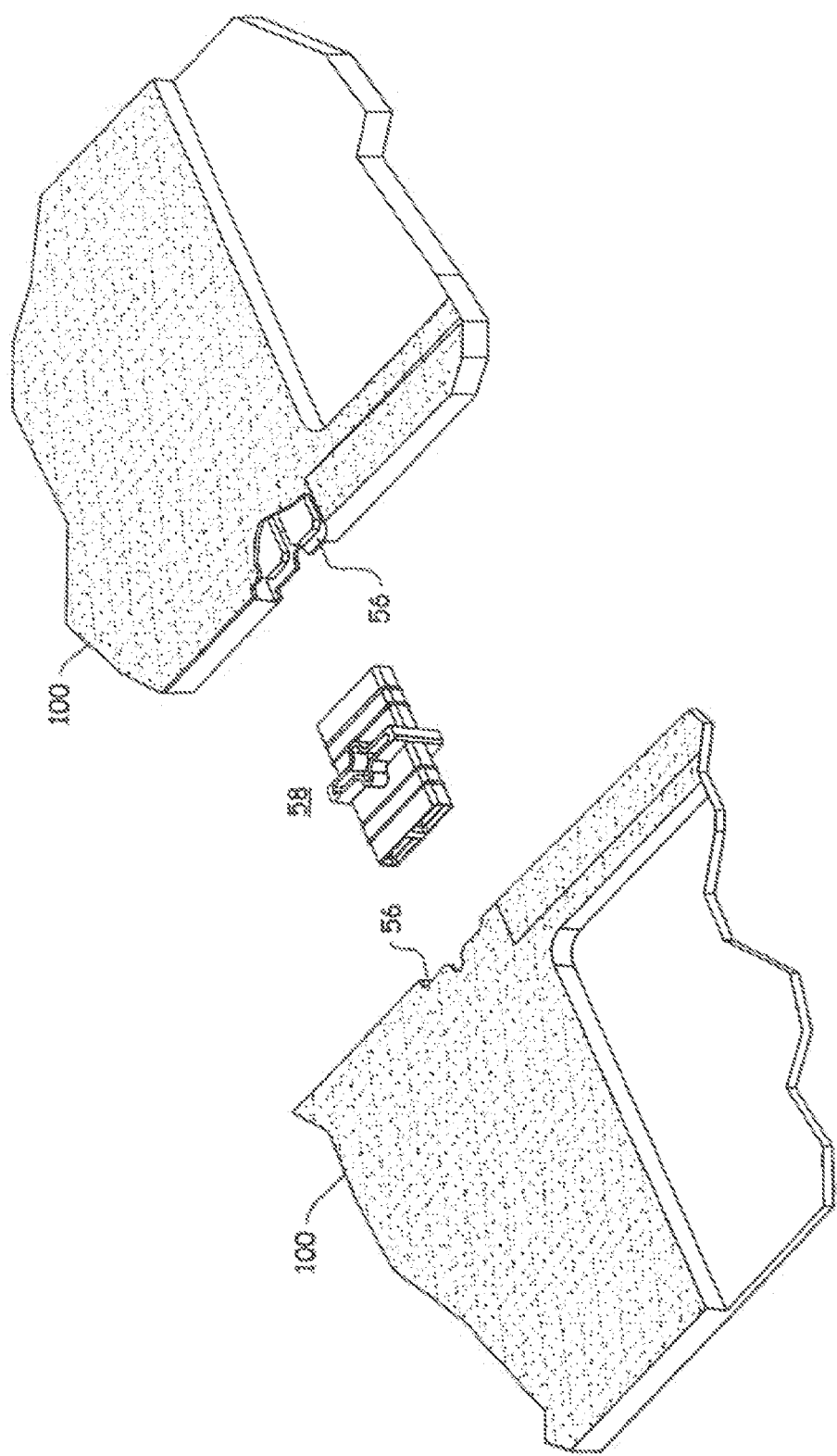
FIG. 6 is an exemplary illustration of an exploded perspective view of two PV devices and the connector of FIG. 5.

The edge piece connector assembly 52 can include a housing 56 integral to the edge piece (e.g. a receptacle housing), as shown in the PV device in FIG. 6, adapted to receive a separate connector piece 58 (i.e., shaped to generally complement an opposing connector housing), a connector integrated housing 59 with a connector piece at least partially integrated therein (FIG. 7), or any combination thereof and at least one electrically conductive member that spans between the first and second end portions and includes connective terminals at opposing ends that are shaped to interlock with an opposing terminal in the opposing connector housing.

Figure 16:
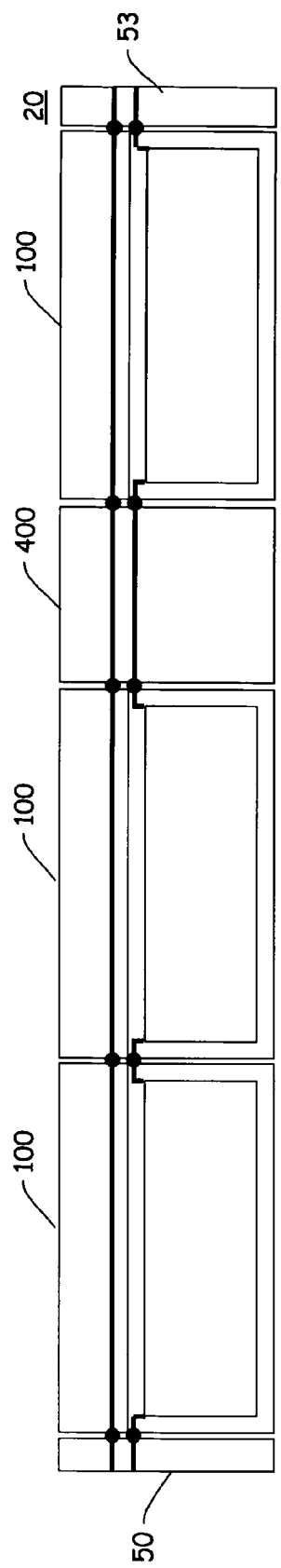
FIG. 16 is an exemplary illustration of a row of PV devices with a spacer device.

The assembly can also include any number of spacer pieces 400 (e.g. as shown in FIG. 16) that may or may not contain any photovoltaic arrays (e.g. power generating means) or other components. It is contemplated that spacer pieces can provide additional functionality to the kit. In one example, a spacer piece 60 can provide a through hole for roof vents. In another example, a spacer piece 60 or pieces can provide an aesthetic function, such as staggering the rows or columns.

It is also contemplated that the assembly or kit can be configured to provide a targeted power output (e.g. 0.1 to 8 KWp or more (KWp defined as kilowatt-peak) and to fit standard building designs (e.g. mass produced homes) that share roof and/or fascia layouts, or can be custom configured for one-off designs. For example, the kit can be configured to fit (e.g. number of PV devices, number of rows, number and location of spacers/edge pieces) one particular roof design that is utilized in a particular model home offered by a builder (e.g. the Beaumont™ model offered by Pulte Homes™).

The individual components that make up the kit are described in further detail and illustrative examples of some of the possible kit configurations are provided below.

PV Device

In an illustrative example, the PV device 100 can be described generally as a three dimensional article that includes an energy producing device (e.g. solar cells), electrical circuitry to transfer the energy produced, and a body which holds the energy producing device and allows it to be effectively mounted onto a structure. It is contemplated that a PV device 100 of the present invention is preferably a discrete part/component that is used in the overall kit.

For example, as shown in FIG. 3, the PV device 100 can be further described as including a photovoltaic cell assembly 110 and a body portion 120 (which can also be referred to as a body support portion where it provides structural support). The body portion 120 having an upper surface portion 122, a lower surface portion 124 and side wall portion 126 spanning therebetween. The body portion 120 can be further described as including a main body portion 222, a side body portion 224, and an optional bottom body portion 226 and locator (not shown). The PV device 100 can also be described as having an active portion 130 and an inactive portion 135. The active portion 130 can include at least the photovoltaic cell assembly 110, a portion of the side body portion 224 and the optional bottom body portion 226. The inactive portion 135 can include at least the main body portion 222, a portion of the side body portion 224, and some or all of the electrical circuitry of the PV device 100.

Figure 4:
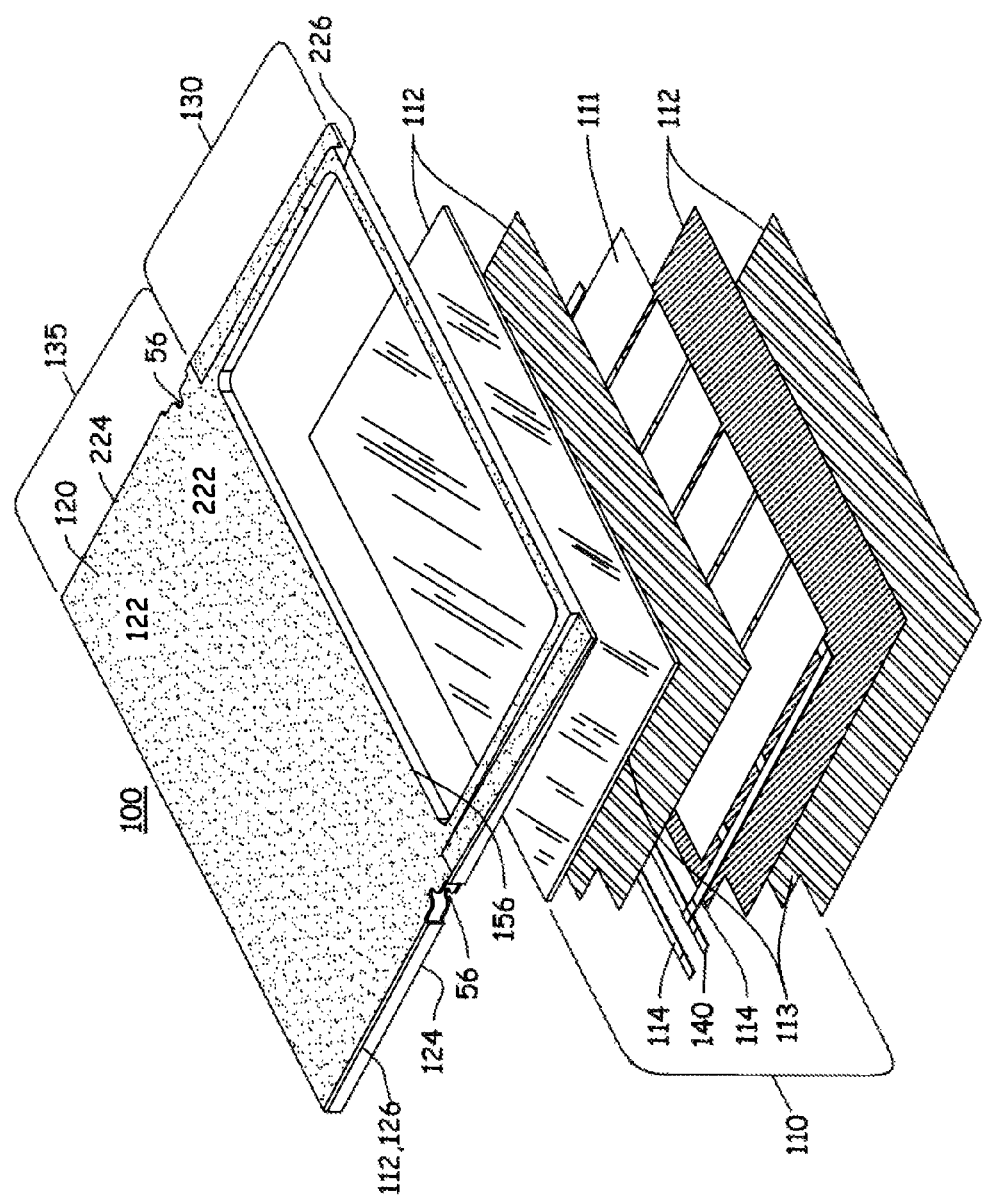
FIG. 4 is one exemplary illustration of an exploded view of a PV device piece according to the present invention.

For example as shown in an exploded view of a PV device 100 in FIG. 4, the photovoltaic cell assembly 110 can be further described as including a photovoltaic cell 111, protective layers 113, and at least some of the electrical circuitry 114 of the PV device. The PV devices 100 can also be described in an alternative fashion. The PV devices 100 can include components such as the photovoltaic cell assembly 110, at least one buss terminal 140, and a body portion 120.

The PV devices 100 can include at least one peripheral edge 112, at least one photovoltaic cell 111 inboard of the at least one peripheral edge 112.

The at least one buss terminal 140, which can function to transfer current to or from the photovoltaic cell assembly 110 via at least one integral photovoltaic connector assembly 57 located within the at least one peripheral edge 112.

The body portion 120 lower surface portion 124 can contact the structure (e.g. building substrate and/or structure). Also having an upper surface portion 122 that receive a fastener (not shown, e.g. nail, screw, staple, rivet, etc.) that attaches the photovoltaic device 100 to the structure. Furthermore, the body portion 120 can be at least partially joined to at least one edge portion of the photovoltaic cell assembly 110 along at least a portion of a bottom segment 156 of the body portion 120 while leaving at least a portion of the at least one photovoltaic cell 111 exposed to receive radiation.

It is contemplated that the PV device 100 can be constructed at least partially of flexible materials (e.g. thin films or deformable materials, with significant plastic or elastic elongation such as plastics, synthetic and natural rubbers, films, elastomers, or the like) to allow at least some flexibility for conforming to an irregular contour in a building structure. It is also contemplated that it can be desirable to at least keep the photovoltaic cell relatively rigid, generally to prevent any cracking of the cell. Thus, some parts of the PV device can be constructed with a more rigid material (e.g. glass plate, mineral filled composites, or polymeric sheets). Although, the photovoltaic cell can be partially or substantially rigid, it is possible for the PV device to be generally flexible. For this invention, flexible means that the PV device is more flexible or less rigid than the substrate (e.g. structure) to which it is attached. Preferably, in the case of a flexible substrate the PV device can bend about a 1 meter diameter cylinder without a decrease in performance or critical damage. Preferably, in the case of a rigid substrate the PV device can bend about 20 meter diameter cylinder without a decrease in performance or critical damage. For example, in the case of a PV device shingle, shingles generally are less rigid than the roof deck; the roof deck provides structural rigidity. In some other examples the roofing product itself provides the necessary rigidity and the roof deck is absent, or minimized.

The photovoltaic cell 110, contemplated in the present invention may be constructed of any number of known photovoltaic cells commercially available or may be selected from some future developed photovoltaic cells. These cells function to translate light energy into electricity. The photoactive portion of the photovoltaic cell is the material which converts light energy to electrical energy. Any material known to provide that function may be used including crystalline silicon, or amorphous silicon. However, the photoactive layer is preferably a layer of IB-IIIA-chalcogenide, such as IB-IIIA-selenides, IB-IIIA-sulfides, or IB-IIIA-selenide sulfides. More specific examples include copper indium selenides, copper indium gallium selenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as CIGSS). These can also be represented by the formula $CuIn(1-x)GaxSe(2-y)Sy$ where x is 0 to 1 and y is 0 to 2. The copper indium selenides and copper indium gallium selenides are preferred. Additional electroactive layers such as one or more of emitter (buffer) layers, conductive layers (e.g. transparent conductive layers) and the like as is known in the art to be useful in CIGSS based cells are also contemplated herein. These cells may be flexible or rigid and come in a variety of shapes and sizes, but generally are fragile and subject to environmental degradation. In a preferred embodiment, the photovoltaic cell assembly 110 is a cell that can bend without substantial cracking and/or without significant loss of functionality. Exemplary photovoltaic cells are taught and described in a number of US patents and publications, including U.S. Pat. No. 3,767,471, U.S. Pat. No. 4,465,575, US20050011550 A1, EP841706 A2, US20070256734 a1, EP1032051A2, JP2216874, JP2143468, and JP10189924a, incorporated hereto by reference for all purposes.

Connector

Figure 5:
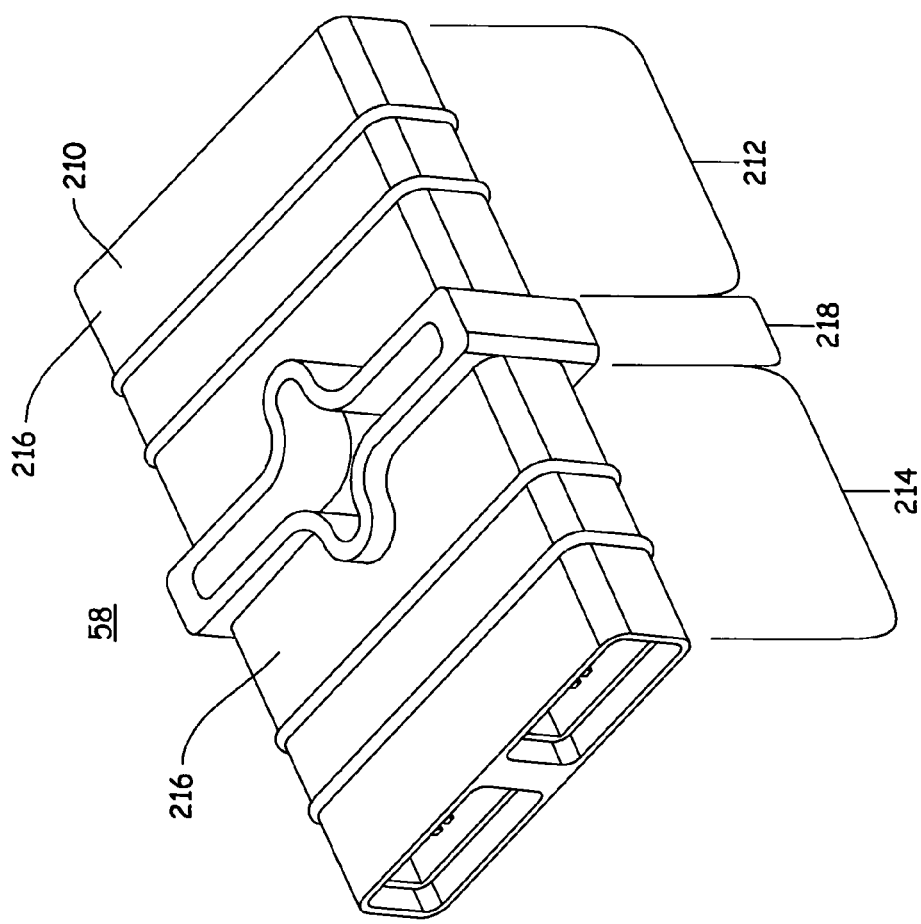
FIG. 5 is an exemplary illustration of a perspective view of a connector piece according to the present invention.
Figure 7:
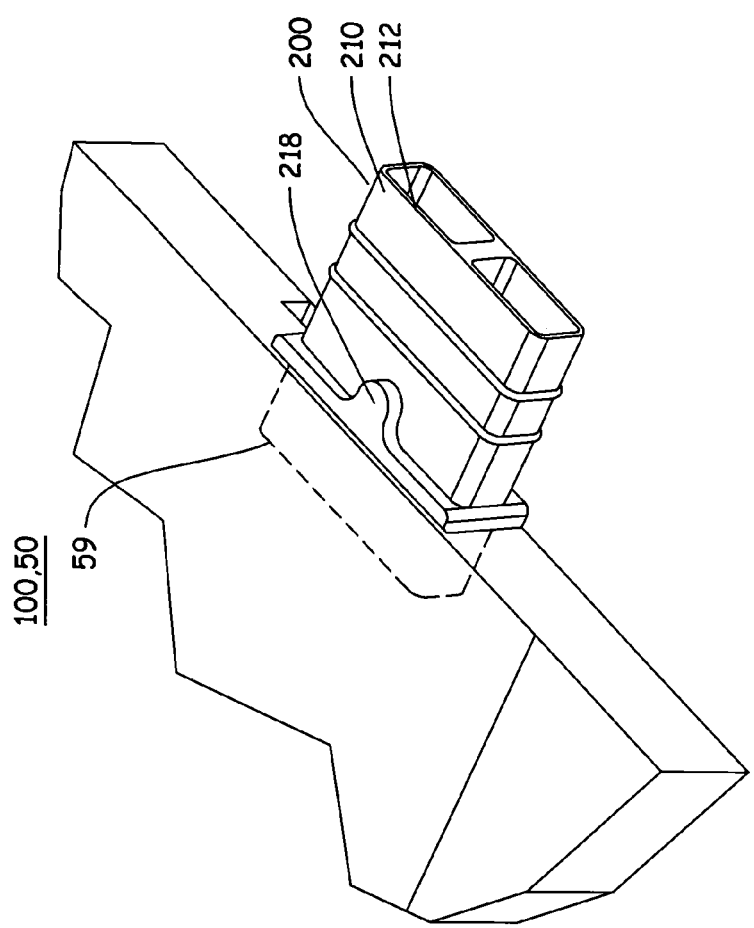
FIG. 7 is an exemplary illustration of a perspective view of a partially integrated connector.
Figure 8:
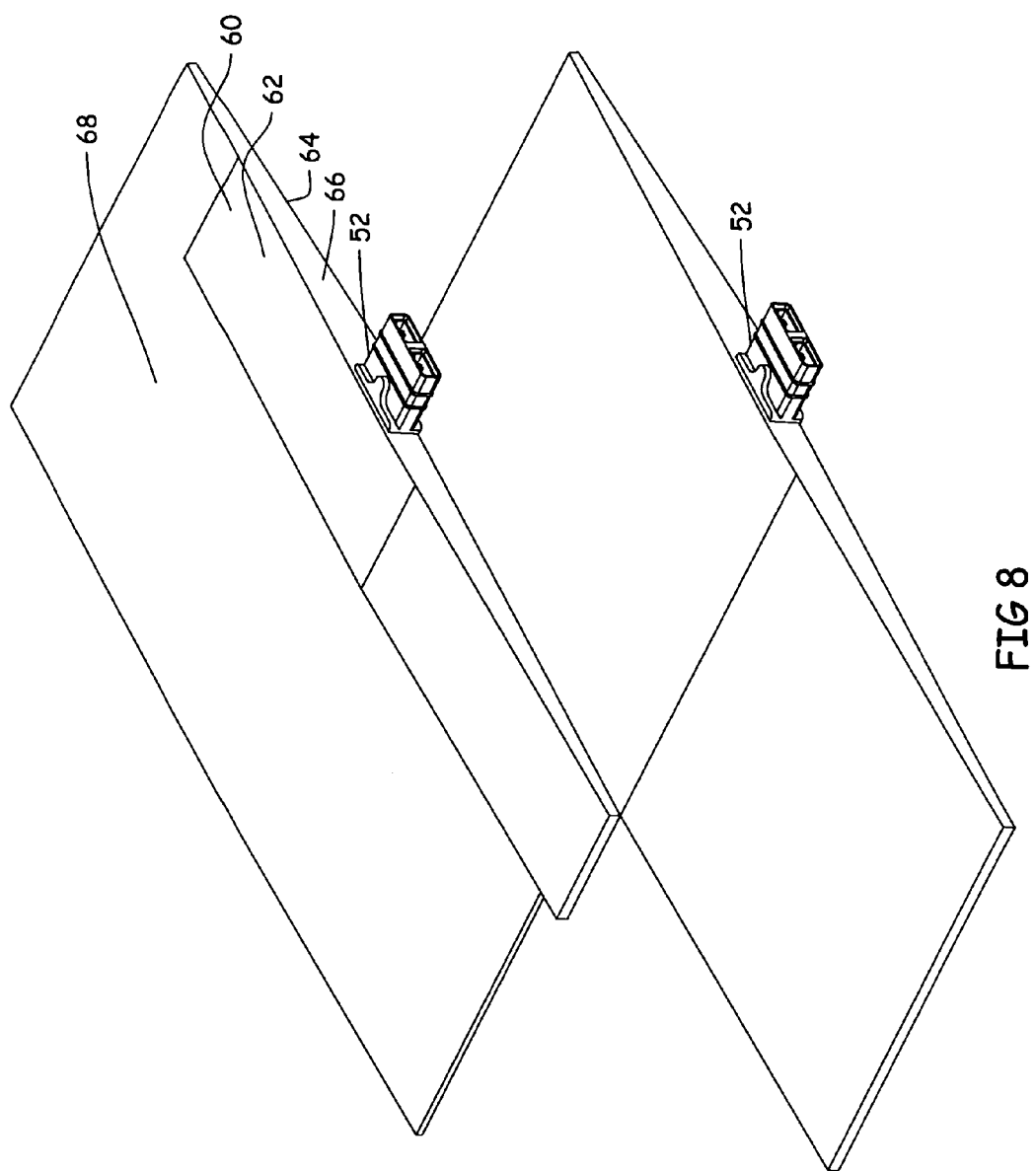
FIG. 8 is an exemplary illustration of a perspective view (top) of one possible edge piece according to the present invention.

It is contemplated that the kit 20 may use a plurality of connectors 58, for example such as those described in U.S. provisional application 61/098,941 hereby incorporated by reference. These connectors can be separate components (e.g. as shown in FIGS. 5-6) or partially integrated into the PV device 100, the edge piece 50, or both (e.g. as shown in FIG. 7). In an illustrative example shown in FIG. 5, the connector 58 can be described generally as including a base portion 210 including a first end portion 212, a second end portion 214 and an outer surface 216. It also can include a locator portion 218 located on the outer surface. In one particular embodiment, the locator portion can be described as including a bearing wall that can be shaped to generally complement an opposing female ("receptacle") connector housing 56 that can be located in a PV device 100 or edge piece 50. Furthermore, upon installation, the bearing wall can at least partially contact an opposing surface in the receptacle connector housing. Moreover, the connector assembly can include at least one electrically conductive member that is substantially surrounded by the base portion and that spans between the first and second end portions and includes connective terminals at opposing ends. These terminals can be shaped to interlock with an opposing terminal in the opposing receptacle connector housing.

Figure 10:
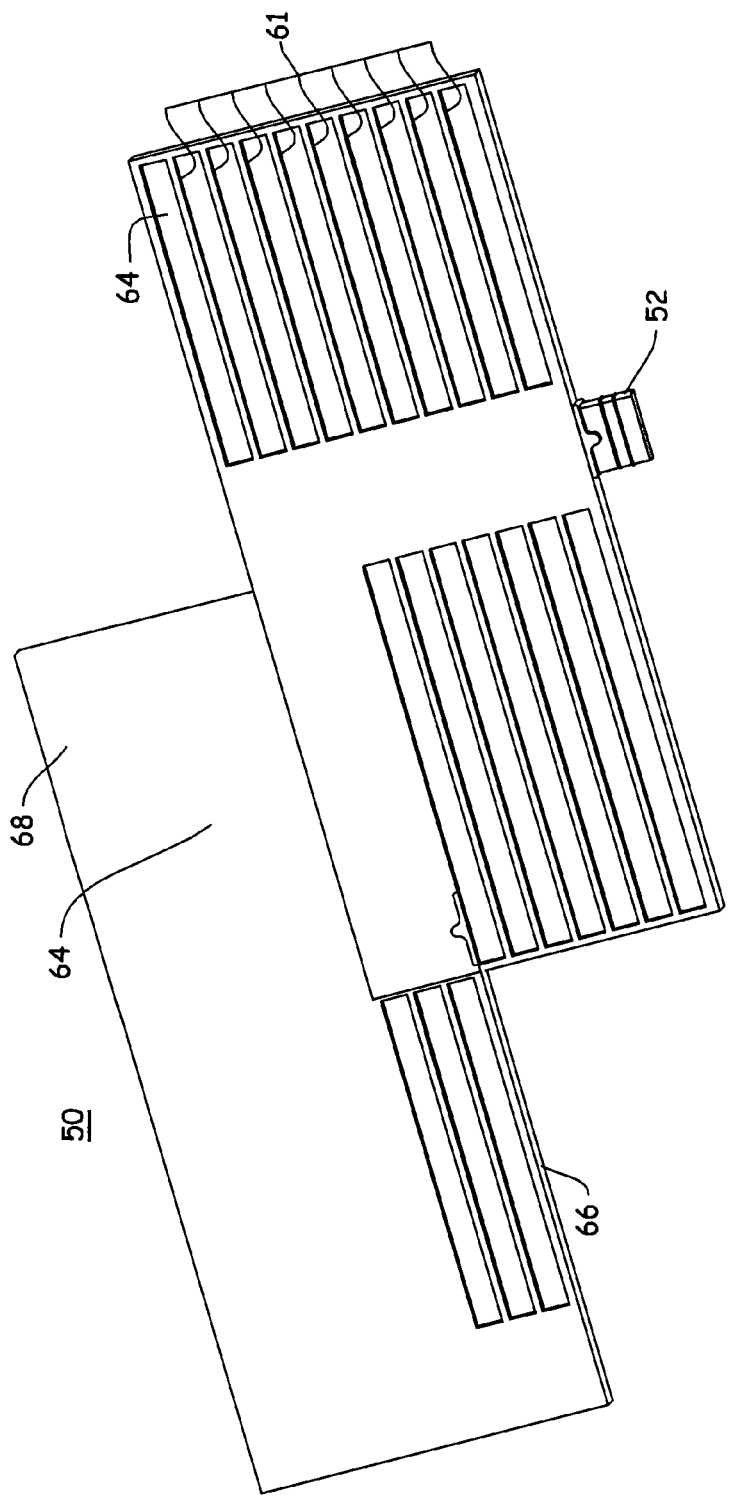
FIG. 10 another exemplary illustration of a perspective view (bottom) of an edge piece with ribs and integrated wiring according to the present invention FIG. 11 another exemplary illustration of a perspective view (bottom) of an edge piece with ribs and a wiring channel according to the present invention.

It is also contemplated that the opposing receptacle connector housing can be integral to an outer wall section (e.g. portions such as top, bottom, or sides of the PV array or edge piece) of the PV device 100 or edge piece 50. The housing can be connected to the PV device or edge piece via a fastener scheme (e.g. mechanical fasteners, adhesives, or a combination thereof) or can be integrated into the PV device or edge piece via the structure of the device/piece (e.g. over-molded into the device or part of the framework of the PV device or edge piece for example as shown in FIG. 10). In either case, it is contemplated that receptacle connector housing integral to or connected to a PV device or edge piece and/or the connector assembly includes a strain relief feature (or combination of one or more features) to allow movement of the assembly while maintaining an electrical contact between the respective terminals.

The edge piece connector assembly may be further characterized by one or any combination of the features described herein, such as the opposing receptacle connector housing is integral to an outer wall section of the edge piece or the photovoltaic array; the connector assembly includes a bypass diode electrically connected to the at least one electrically conductive member; the connector assembly includes an indicator device to communicate a circuit status; the connector assembly includes a locking device that locks the male ("header") connector element to the opposing receptacle connector housing upon installation; the connector assembly includes a second electrically conductive member, the first end portion of which is integral to the outer wall section of the photovoltaic array or edge piece, the connector element (header or receptacle) is integral to the first connector housing (header or receptacle), an outwardly projecting portion in the locator portion that projects upward towards a top surface that is generally coplanar with a top surface of the photovoltaic array or edge piece.

It should be appreciated that the above referenced aspects and examples are non-limiting, as others exist within the present invention, as shown and described herein.

Edge Piece

The edge piece 50, for example as shown in FIGS. 8-11 and 22-23, generally function to physically and/or electrically connect at least two rows or columns of PV devices 100 and/or to connect a return circuit in a single PV device or row (e.g. a starter piece 53). It can also function to connect one edge piece to another edge piece. The edge piece 50 can be disposed at a single end, opposing ends, within a row/column, or any combination thereof of a row/column of PV devices 100. It is contemplated that an edge piece 50 can include a through roof (or building structure) connector feature (e.g. a structure pass-through electrical connector assembly 510) or electrical leads or insulated wires (e.g. electrical lead assembly) that allow for the electrical output of the PV device or devices to be electrically connected to the complimentary electrical devices located within the structure. It is also contemplated that a filler piece 54 may be used to fill any possible gaps in the edge pieces when assembled. The edge piece can be attached to the structure in the same manner as the PV device 100, for example with a fastener such as a nail or screw being driven through a portion of the body. The fastener preferably being placed in an area that does not contain any additional components (e.g. wires, connectors and the like). It is contemplated that a fastening zone (not shown) can be marked on the edge piece to aid in installation (e.g. physical markings on the PV device, edge piece, or both such as "nail here" or "fastener" or some other graphical demarcation). The edge piece 50 can also include additional components such as electrical transmission lines (e.g. wires), electrical switches, fuses, by-pass diodes, solar cells, circuit status indicators, or any combination thereof.

As shown in FIGS. 8-13, it is contemplated that the main body portion 60 can have an outer surface portion 62, an inner surface portion 64 (e.g. portion that contacts the building or structure surface) and side surface portions 66 that connect the outer and inner surface portions 62, 64. Optionally, the inner surface portion 64 can be solid (e.g. a unitary block) or have geometric features (e.g. ribs 61 for example as shown in FIG. 10). The main body portion 60 can be any number of shapes or sizes, but preferably is shaped to complement the shape of the PV device 100 that it connects thereto. In this example, the main body portion 60 is "stepped" vertically to allow for a complementary fit to two rows of PV devices that are stacked and layered (e.g. akin to roofing shingles). The main body portion 60 can also be "staggered" horizontally to allow for a complimentary fit to the two rows of PV devices, if the devices are installed with an offset (again, akin to roofing shingles). It also can include a flashing portion 68 that can be adapted to interface with and/or sit under other building materials (e.g. abutting standard roofing shingles, trim materials, building siding, or the like). It is also contemplated that the edge piece 50 can only have only one edge connector assembly 52, wherein the one edge connector can be utilized to complete a return circuit in a PV device row (e.g. a starter piece 53).

Figure 9:
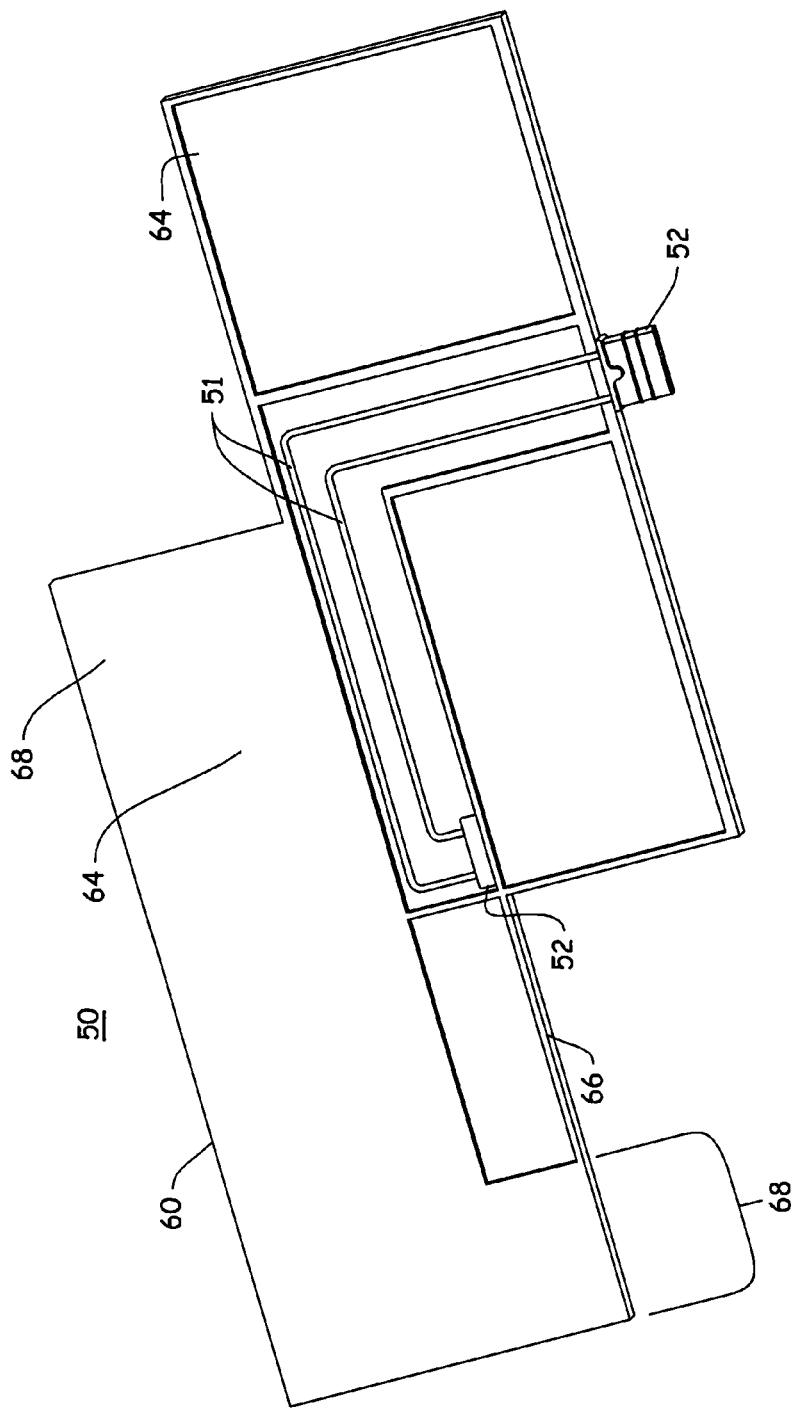
FIG. 9 is an exemplary illustration of a perspective view (bottom) of one possible edge piece according to the present invention.

In one illustrative example, shown in FIG. 9, a bottom view of an edge piece 50 can be described generally as including a main body portion 60 and two edge connector assembly 52 (one example of which may be "the partially integrated connector assembly" as described above) and an electrical element or elements 51 (e.g. wires, electrically conductive foil or polymers) spanning between the two edge connector assemblies 52, one of which is hidden behind the body portion 60 of the edge piece.

In another illustrative example shown in FIG. 10, (an alternative bottom view of an edge piece) the electrical element 51 can be integrally connected to the edge piece 50 (e.g. molded within the piece). Preferably, the elements are wires or foil pieces that are molded into the edge piece 50 (partially or fully encapsulated by the edge piece) along with at least a portion of the connector assembly 52.

Figure 11:
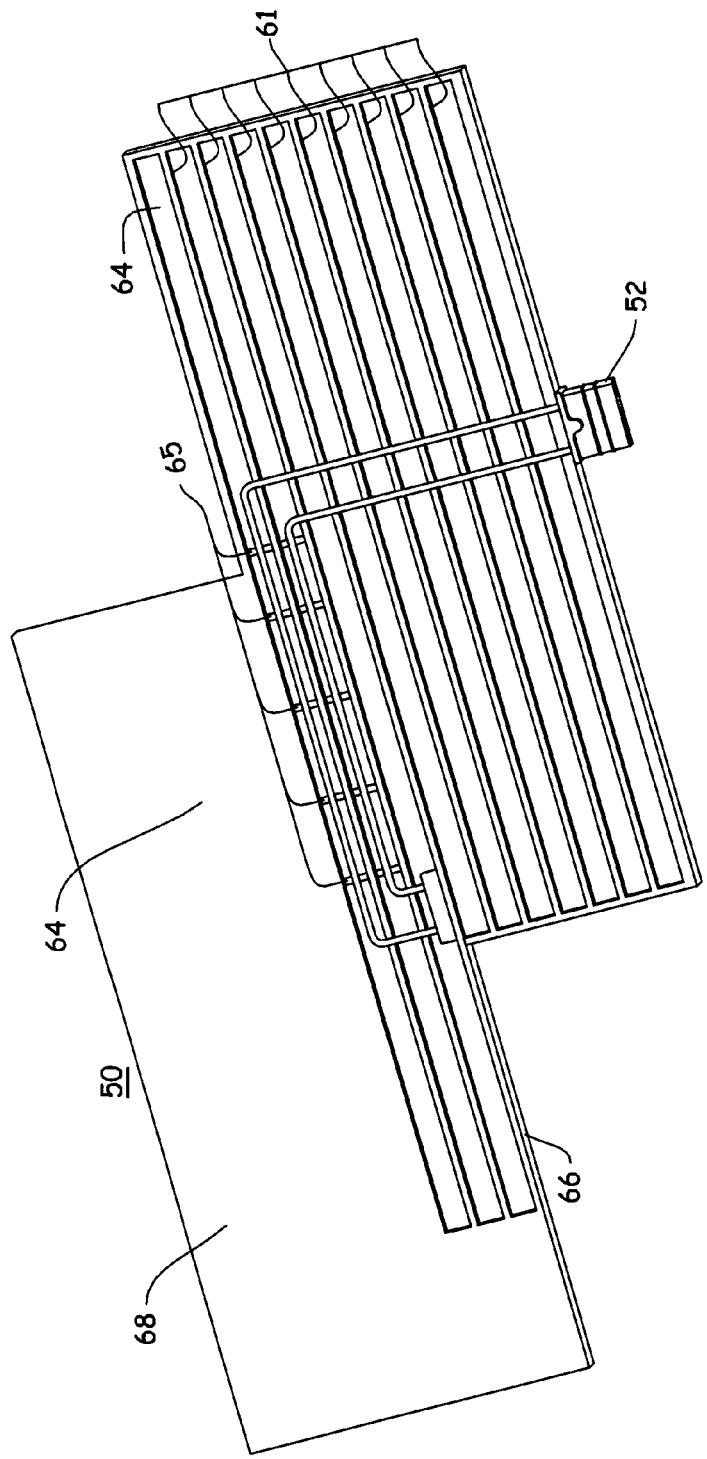
Figure 12:
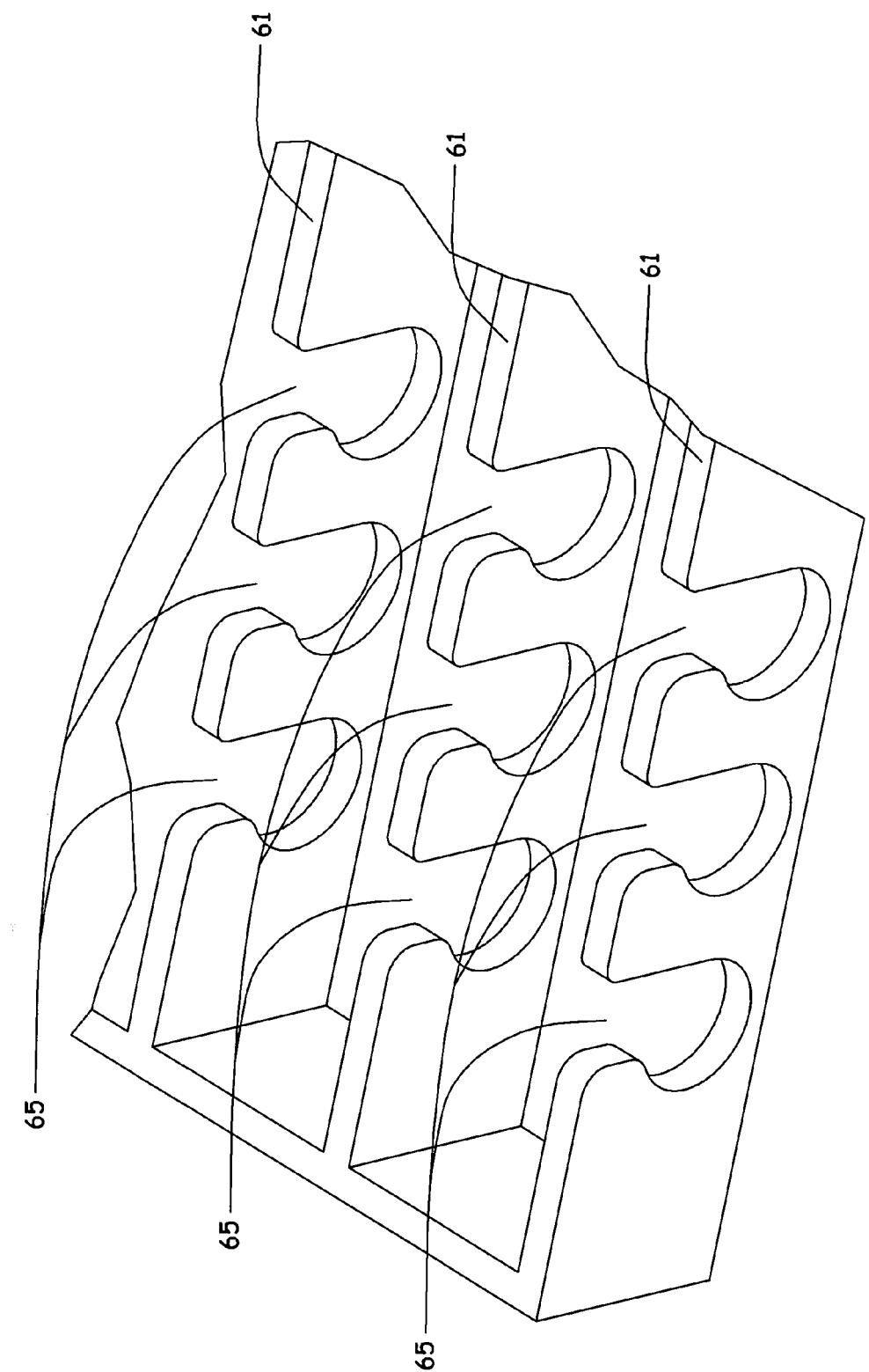
FIG. 12 is a perspective view of ribs and wiring channel of FIG. 11

In yet another illustrative example, shown in FIGS. 11-12 (also bottom views of the edge piece), the electrical element 51 can be removably attached via any number of attachment features (e.g. adhesive, mechanical fasteners, press-fit into channels 65, for example, cut into ribs 61, shown in FIG. 12, or any combination thereof).

The main body portion 60 can be constructed of any number of materials (e.g. polymers, metals and/or ceramics), so long as it resists environmental degradation as it is exposed to the outdoor over the years of service (e.g. 10, 20 or 30 years or more). Preferred materials or combinations of materials include a filled or unfilled moldable plastic (e.g. polyolefins, acrylonitrile butadiene styrene, hydrogenated styrene butadiene rubbers, polyester amides, polysulfone, acetel, acrylic, polyvinyl chloride, nylon, polyethylene terephthalate, polycarbonate, thermoplastic and thermoset polyurethanes, synthetic and natural rubbers, epoxies, styrene-acrylonitrile ("SAN"), polymethyl methacrylate, polystyrene, or any combination thereof). Fillers can include one or more of the following: colorants, fire retardant ("FR") or ignition resistant ("IR") materials, reinforcing materials, such as glass or mineral fibers, surface modifiers. Plastic can also include anti-oxidants, release agents, blowing agents, and other common plastic additives.

Illustrative Examples

The various examples discussed below and shown in the figures generally attempt to take PV devices, edge pieces, connectors and optionally other components (e.g. spacers 400 as shown in FIG. 16) to create a photovoltaic device kit 20 that when assembled can be configured to provide a targeted power output and preferably require two or less electrical connections to the inverter or the underlying building electrical system. It is contemplated that the geometry of these kits can be varied and the following examples should not be considered as limiting. Thus, for the sake of clarity, the following examples are provided to illustrate the invention but are not intended to limit the scope thereof. The rows of PV devices can be staggered (e.g. as traditional roofing shingles) or lined up in columns. The rows and/or columns can be vertical, horizontal or anywhere in-between. In all the illustrative examples discussed below, it is assumed that the PV devices can be physically and electrically connected to one another within the row via connector assemblies as described previously. The lines 600 shown represent the electrical transmission lines or circuits within the PV devices 100 and/or the edge pieces 50 and the dots represent connectors.

Figure 13:
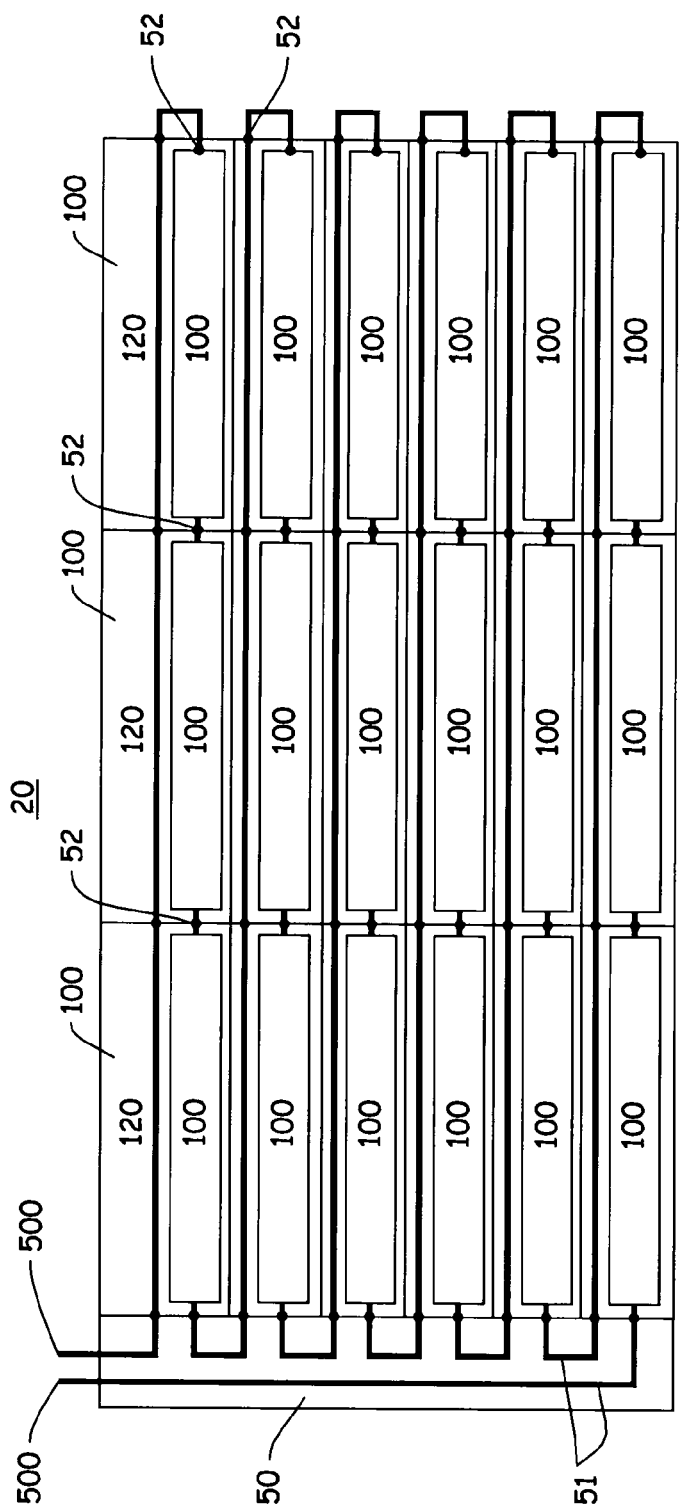
FIG. 13 is an exemplary illustration of a schematic of one possible kit derivation according to the present invention.

Referring to FIG. 13, a first illustrative example of the present invention is shown (schematical view). In this first example, a photovoltaic device kit 20 can include at least a plurality of PV devices 100 in multiple rows and one edge piece 50 (although multiple edge pieces that are connected together are also contemplated). At one end of a row of PV devices 100, the PV devices can be physically and electrically connected to an edge piece 50 via an edge piece connector assembly 52 (represented by dots). The edge piece can include electrical element or elements 51 that electrically connect the rows together and have a single electrical output 500 from the kit 20 at or near an outer edge of the kit.

Figure 24:
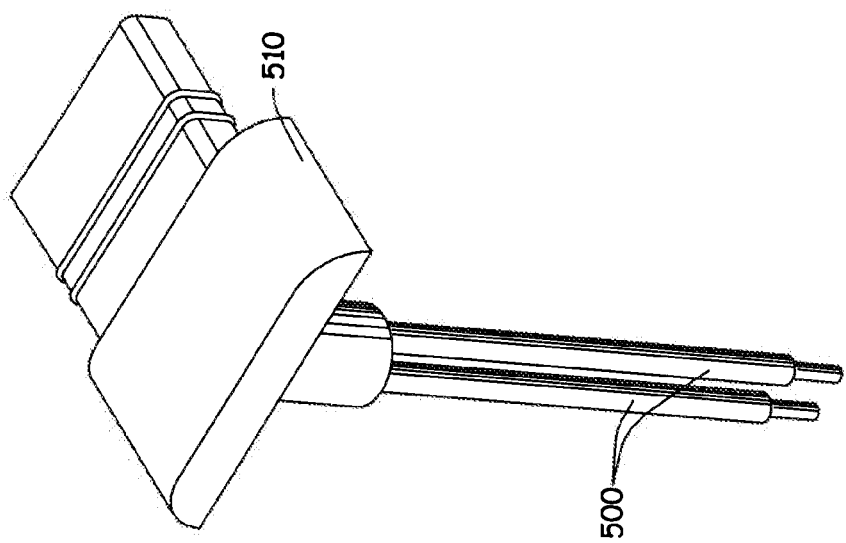
FIG. 24 an exemplary illustration of a perspective view of a structure pass-through electrical connector assembly.

It is contemplated that the electrical output 500 may be accomplished via a pass-through electrical connector assembly 510 (for example as shown in FIG. 24 as a part of a connector assembly) or electrical lead assembly (for example a set of wires attached to an edge piece or a connector assembly—not shown)

Figure 14:
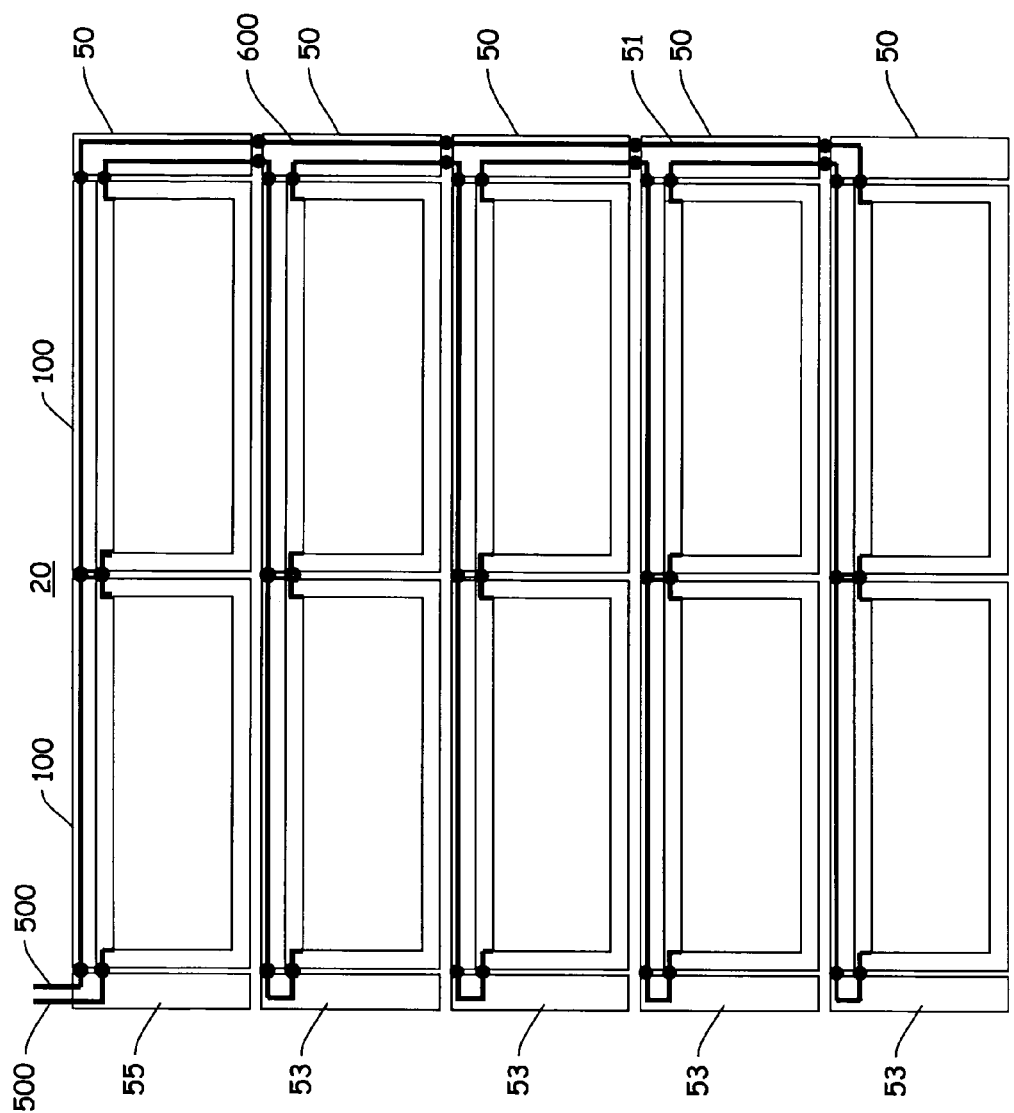
FIG. 14 is an exemplary illustration of a schematic of another possible kit derivation according to the present invention.

Referring to FIG. 14, a second illustrative example of the present invention is shown (schematical view). In this second example, a photovoltaic device kit 20 can include at least a plurality of PV devices 100 in multiple rows and multiple edge pieces 50 (one set on each row end). At both ends of a row of PV devices 100, the PV devices can be physically and electrically connected to an edge piece 50 via an edge piece connector assembly 52 (represented by dots). The edge piece can include electrical element or elements 51 that electrically connect the rows together and have one electrical output 500 from the kit 20 at or near an outer edge of the kit.

Figure 15:
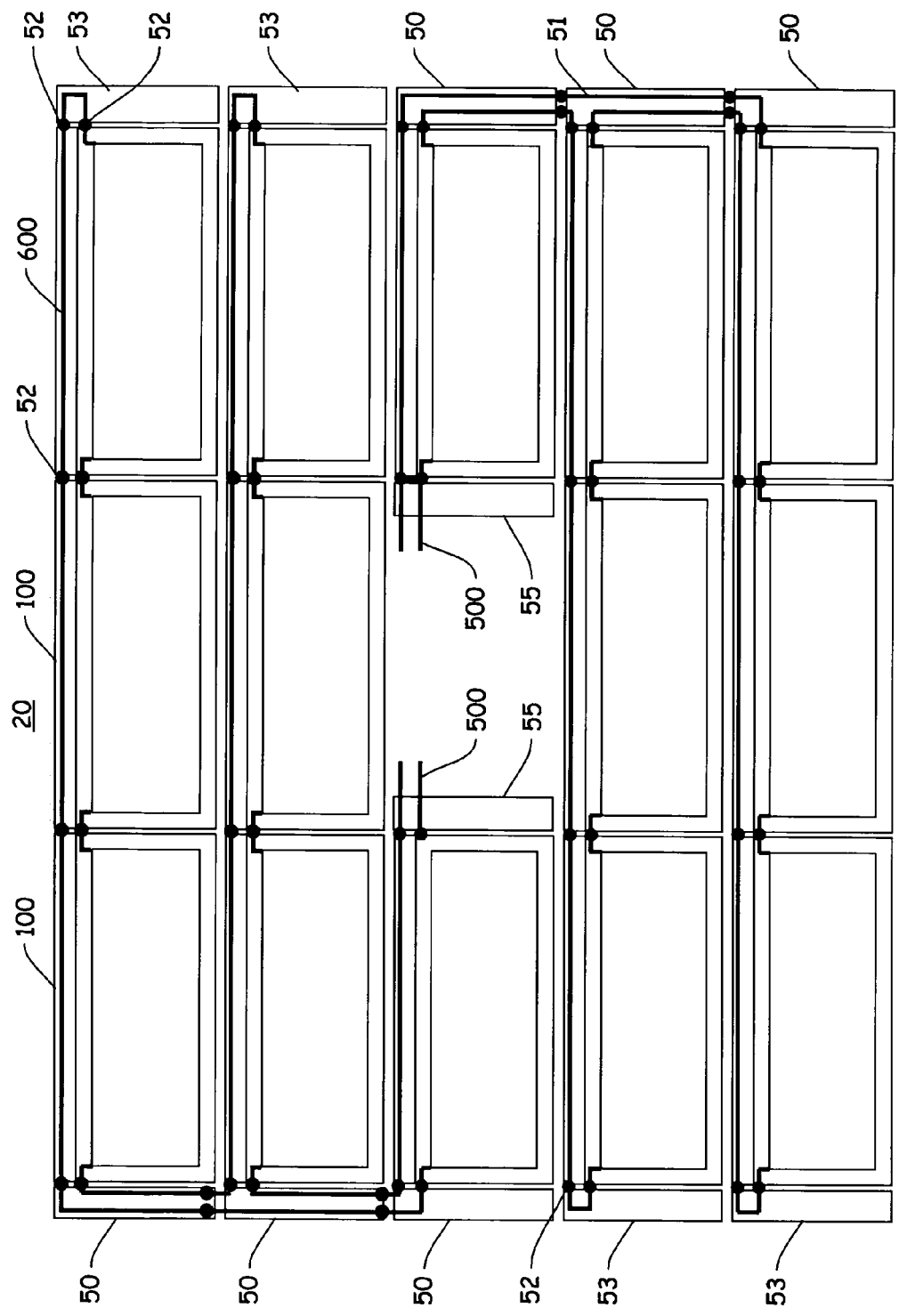
FIG. 15 is an exemplary illustration of a schematic of another possible kit derivation according to the present invention.

Referring to FIG. 15, a third illustrative example of the present invention is shown (schematical view). In this third example, a photovoltaic device kit 20 can include at least a plurality of PV devices 100 in multiple rows and multiple edge pieces 50 (one set on each row end). At both ends of a row of PV devices 100, the PV devices can be physically and electrically connected to an edge piece 50 via and edge piece connector assembly 52. The edge piece can include electrical element or elements 51 that electrically connect the rows together and have two electrical outputs 500 from the kit 20 at or near an inner edge of the kit.

Referring to FIG. 16, a single row of PV devices 100 including an exemplary spacer piece 400 is shown.

Figure 17:
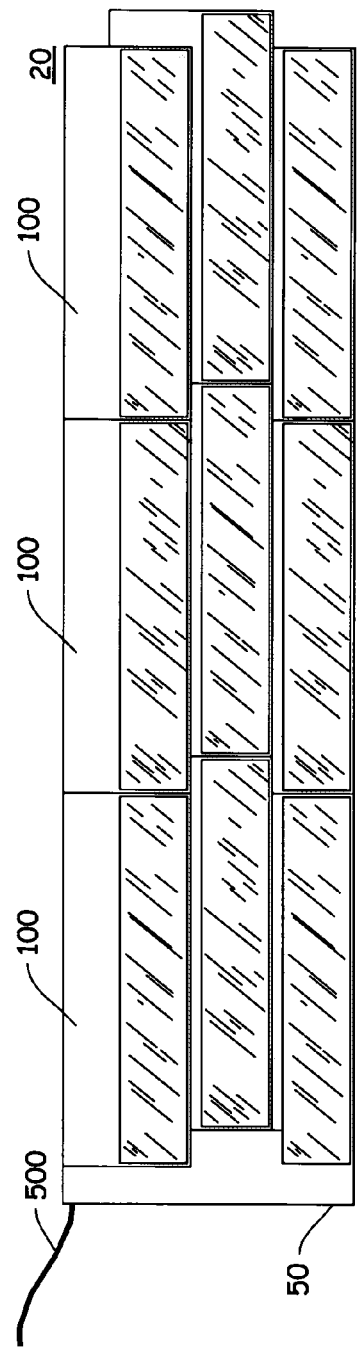
FIG. 17 is an exemplary illustration of a schematic of another possible kit derivation according to the present invention.

Referring to FIG. 17, a fourth illustrative example of the present invention is shown (schematical view). This example is similar to the first example shown in FIG. 13 except with staggered rows of PV devices 100.

Figure 18:
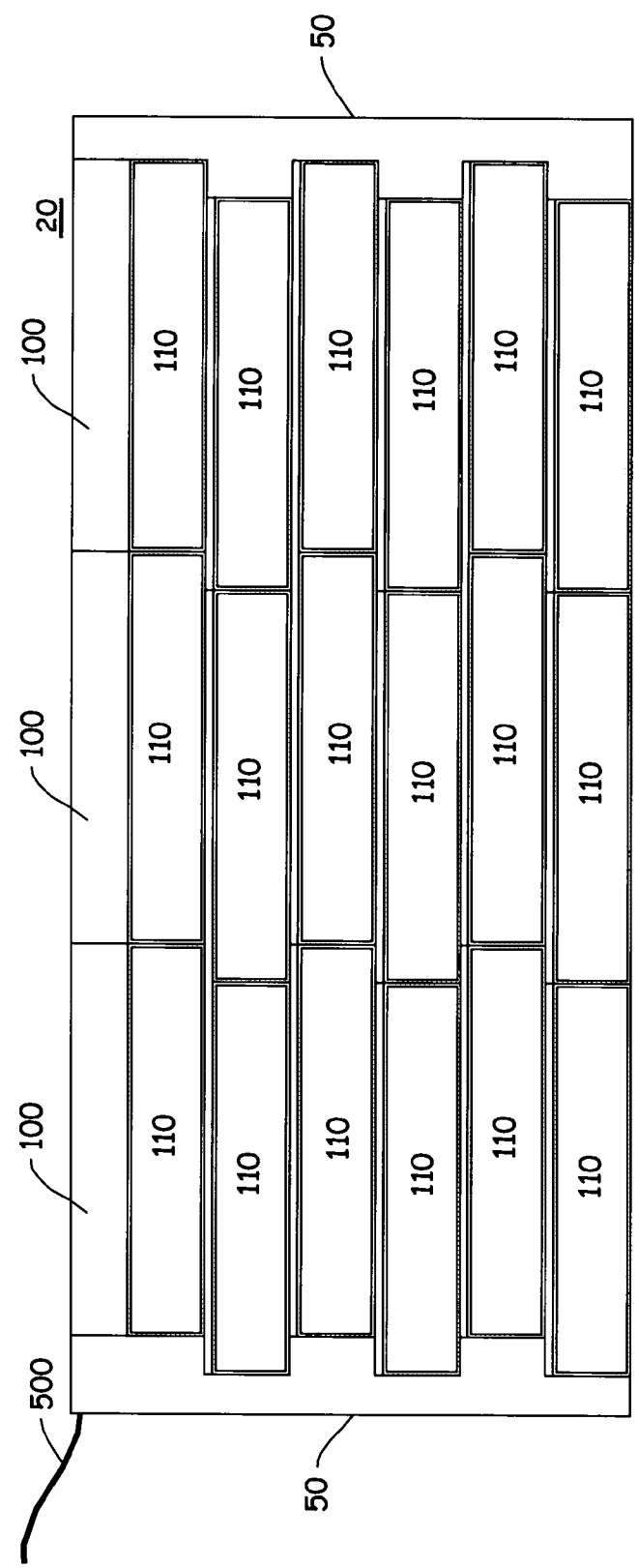
FIG. 18 is an exemplary illustration of a schematic of another possible kit derivation according to the present invention.

Referring to FIG. 18, a fifth illustrative example of the present invention is shown (schematical view). This example is similar to the second example shown in FIG. 14 except, with staggered rows of PV devices 100.

Figure 22:
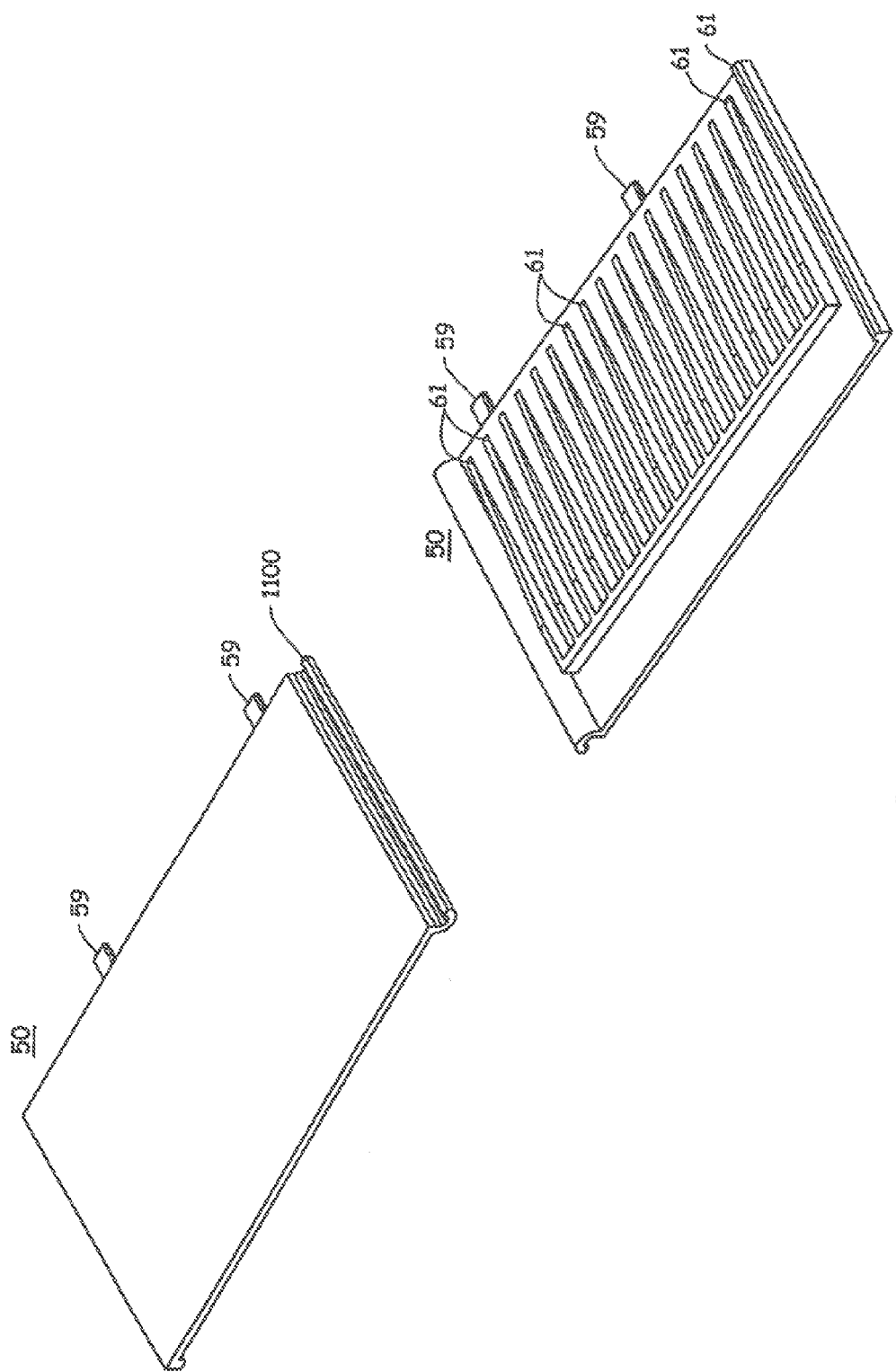
FIG. 22 an exemplary illustration of two perspective views (top and bottom) of an edge piece (column kit—top) according to the present invention.
Figure 23:
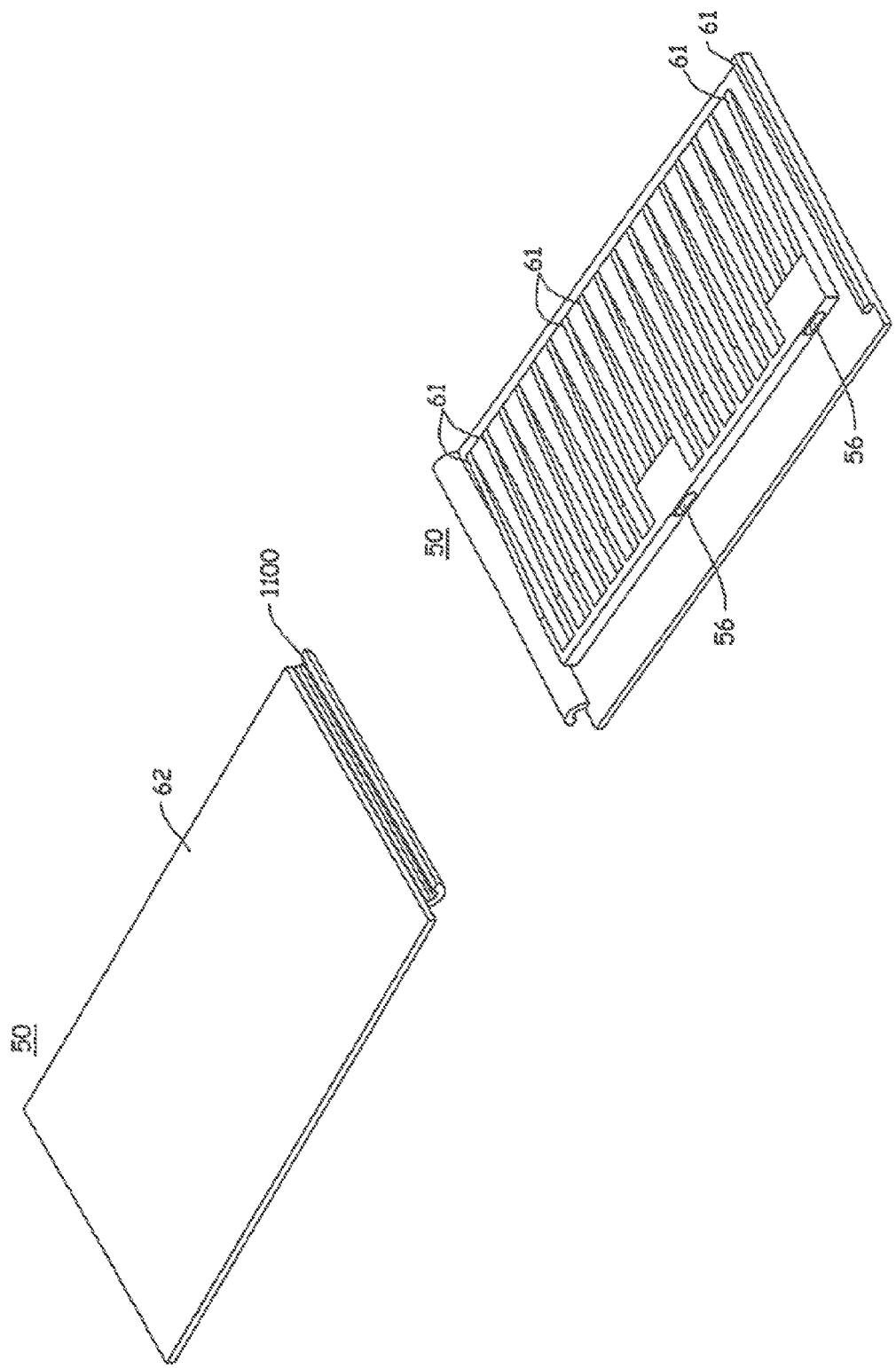
FIG. 23 an exemplary illustration of two perspective views (top and bottom) of an edge piece (column kit—bottom) according to the present invention.

According to another embodiment, tile style installations (e.g. columns) are preferably arranged as shown in FIGS. 19 and 20. Referring to FIGS. 19-23, a sixth illustrative example of the present invention is shown. In this example, one possible vertical configuration of PV devices 100 is shown (e.g. 2 rows×3 columns). In this example 3 columns of PV devices 100 include a flow channel 1100 on one side that can aid in water flow control and/or provide an interlocking function. Also, edge pieces 50 are provided with geometry appropriate to fit in this vertical configuration and with different geometries between edge pieces at the top of the column versus the bottom of the column (e.g. as seen in FIGS. 22 and 23). The fully assembled kit 20 is shown in FIGS. 19 and 20. Also shown in this example are ribs 61 that are formed on the back side of the PV devices and edge pieces. These ribs 61 can help reduce the mass of the components and aid in providing the desired rigidity for the components. Rib designs can be incorporated into both the vertical (column) and horizontal (row) examples or embodiments.

In FIG. 20, a schematic of one possible electrical circuit is shown with connectors 52 and electrical element 51 (wiring preferably integral to the PV devices and edge pieces. In the vertical configuration of the kit 20, the physical and electrical connections to the PV devices 100 occur at or near the top and bottom of the devices (versus at the sides as in the row configurations described in the earlier examples).

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention can have been described in the context of only one of the illustrated embodiments, such feature can be combined with one or more other features of other embodiments, for any given application. It will also be appreciated from the above that the fabrication of the unique structures herein and the operation thereof also constitute methods in accordance with the present invention.

The preferred embodiment of the present invention has been disclosed. A person of ordinary skill in the art would realize however, that certain modifications would come within the teachings of this invention. Therefore, the following claims should be studied to determine the true scope and content of the invention.

Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes.

The term "consisting essentially of" to describe a combination shall include the elements, ingredients, components or steps identified, and such other elements ingredients, components or steps that do not materially affect the basic and novel characteristics of the combination.

The use of the terms "comprising" or "including" to describe combinations of elements, ingredients, components or steps herein also contemplates embodiments that consist essentially of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps.

| ELEMENT NUMBER TABLE | |
| --- | --- |
| photovoltaic device assembly or kit | 20 |
| edge piece | 50 |
| electrical element of the edge piece | 51 |
| edge connector assemblies | 52 |
| starter piece | 53 |
| filler piece | 54 |
| end piece | 55 |
| receptacle connector housing | 56 |
| separate connector piece | 58 |
| integral photovoltaic connector assembly | 57 |
| header connector housing | 59 |
| main body portion | 60 |
| ribs | 61 |
| outer surface portion | 62 |
| inner surface portion | 64 |
| channels | 65 |
| side surface portions | 66 |
| flashing portion | 68 |
| photovoltaic devices | 100 |
| photovoltaic cell assembly | 110 |
| a photovoltaic cell | 111 |
| peripheral edge | 112 |
| protective layers | 113 |
| electrical circuitry | 114 |
| body portion | 120 |
| upper surface portion | 122 |
| lower surface portion | 124 |
| side wall portion | 126 |
| active portion | 130 |
| inactive portion | 135 |
| buss terminal | 140 |
| bottom segment | 156 |
| base portion | 210 |
| first end portion | 212 |
| second end portion | 214 |
| outer surface | 216 |
| locator portion | 218 |
| main body portion | 222 |
| side body portion | 224 |
| body portion | 226 |
| spacer piece | 400 |
| electrical output | 500 |
| pass-through electrical connector assembly | 510 |
| electrical transmission lines in PV device | 600 |
| flow channel | 1100 |

What is claimed is:

1. A photovoltaic device assembly comprising:
   a. a plurality of photovoltaic devices arranged in at least two rows or columns and including:
      i. a plurality of first photovoltaic devices individually interconnected via a plurality of photovoltaic array connector assemblies in a first row or a first column, wherein the plurality of first photovoltaic devices include a first electrical return line;
      ii. a plurality of last photovoltaic devices individually interconnected via a plurality of photovoltaic array connector assemblies in a last row or a last column, wherein the plurality of last photovoltaic devices include a last electrical return line;
   b. a plurality of edge pieces including:
      i. an end edge piece including:
         1. a connector assembly that connects to a first end or a second end of the plurality of last photovoltaic devices and
         2. a pass-through electrical connector or an electrical lead assembly,
      wherein an end electrical circuit extends between the connector assembly and the pass-through electrical connector or the electrical lead assembly;
      ii. a starter edge piece including:
         1. a single edge connector assembly connected to a first end or a second end of the plurality of first photovoltaic devices and including a starter electrical circuit connecting the first electric return line to the plurality of first photovoltaic devices that are individually interconnected so that energy is directed between the plurality of first photovoltaic devices and the first electrical return line; and
      iii. one or more edge pieces each including two or more edge electrical circuits spanning between and connecting two of the at least two rows or columns at a first end, a second end or both ends; and
      wherein the one or more edge pieces are located between the end edge piece and the starter edge piece;
   wherein the plurality of first photovoltaic devices and the plurality of last photovoltaic devices comprise:
   A. a photovoltaic cell assembly including
      i. at least one peripheral edge and
      ii. at least one photovoltaic cell inboard of the at least one peripheral edge,
      wherein the at least one photovoltaic cell includes a photoactive portion and includes a surface that allows transmission of light energy to the photoactive portion for conversion into electrical energy;
B. at least one bus terminal for transferring current to or from the photovoltaic cell assembly via at least one integral photovoltaic connector assembly located within the at least one peripheral edge; and
C. a body portion including:
  i. a lower surface portion that contacts a structure, and
  ii. an upper surface portion that receives a fastener that attaches the plurality of first photovoltaic devices and the plurality of last photovoltaic devices to the structure.

2. The photovoltaic device assembly according to claim 1, wherein the body portion is at least partially joined to at least one edge portion of the photovoltaic cell assembly along at least a portion of a bottom segment of the body portion while leaving the surface of the at least one photovoltaic cell exposed.

3. The photovoltaic device assembly according to claim 2, wherein the body portion and the at least one peripheral edge at least include a unitary polymeric portion.

4. The photovoltaic device assembly according to claim 1, wherein the starter edge piece and the end edge piece comprise a polymeric body that substantially envelops at least a portion of the starter and end electrical circuits respectfully.

5. The photovoltaic device assembly according to claim 2, wherein the plurality of integral photovoltaic connector assemblies each include a locator feature for locating one of the plurality of photovoltaic devices to another photovoltaic device or to one of the plurality of edge pieces.

6. The photovoltaic device assembly according to claim 1, wherein at least one of the at least two rows or columns, include at least one spacer device located between two of the plurality of photovoltaic devices arranged in the at least two rows or columns.

7. The device assembly according to claim 2 wherein the structure is a building.

8. The photovoltaic device assembly of claim 1, wherein the plurality of photovoltaic array connector assemblies in the at least two rows or columns are a separate piece from each of the plurality of photovoltaic devices in each of the at least two rows or columns.

9. The photovoltaic device assembly of claim 1, wherein the starter electrical circuit, edge electrical circuit, and the end electrical circuit are integrally connected to the starter end piece, the one or more edge pieces, and the end edge piece respectively and are partially encapsulated or fully encapsulated in the starter end piece, the one or more edge pieces, and the end edge piece respectively.

10. The photovoltaic device assembly of claim 1, wherein the starter electrical circuit in the starter edge piece extends within an interior surface of the starter edge piece from the single edge connector assembly and back to the single edge connector assembly.

11. The photovoltaic device assembly of claim 1, wherein the end electrical circuit in the end edge piece extends within an interior surface of the end edge piece between the connector assembly and the pass-through electrical connector or the electrical lead assembly.

12. The photovoltaic device assembly of claim 1, wherein the starter edge piece, the end edge piece, and the one or more edge pieces are all separate pieces.

13. The photovoltaic device assembly of claim 1, wherein the one or more edge pieces comprise:
a main body portion which physically connects two or more rows or columns of photovoltaic devices;
the one or more edge pieces electrically connect two or more rows or columns to an electrical return circuit in a row or column of one of the at least two rows or columns.

* * * * *